(12) United States Patent
Tsai et al.

(10) Patent No.: US 12,237,284 B2
(45) Date of Patent: Feb. 25, 2025

(54) SEMICONDUCTOR STRUCTURE COMPRISING DUMMY FEATURE INTERPOSED BETWEEN THE BONDING CONNECTORS

(71) Applicant: Taiwan Semiconductor Manufacturing Company, Ltd., Hsinchu (TW)

(72) Inventors: Chen-Yu Tsai, Taoyuan (TW); Ku-Feng Yang, Hsinchu County (TW); Tsang-Jiuh Wu, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 330 days.

(21) Appl. No.: 17/672,727

(22) Filed: Feb. 16, 2022

(65) Prior Publication Data

US 2023/0260940 A1    Aug. 17, 2023

(51) Int. Cl.
*H01L 23/00*    (2006.01)

(52) U.S. Cl.
CPC ............. *H01L 24/06* (2013.01); *H01L 24/03* (2013.01); *H01L 24/08* (2013.01); *H01L 2224/06517* (2013.01); *H01L 2224/08145* (2013.01)

(58) Field of Classification Search
CPC ......... H01L 24/06; H01L 24/08; H01L 24/03; H01L 2224/06517; H01L 2224/08145

USPC .................................. 257/773; 438/618, 666
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2011/0074038 A1* | 3/2011 | Liu | H01L 21/7682 257/773 |
| 2021/0035907 A1* | 2/2021 | Chen | H01L 21/76877 |
| 2021/0257290 A1* | 8/2021 | Shih | H01L 21/76838 |

\* cited by examiner

*Primary Examiner* — Didarul A Mazumder
(74) *Attorney, Agent, or Firm* — JCIPRNET

(57) ABSTRACT

A semiconductor structure and a manufacturing method thereof are provided. The semiconductor structure includes an interconnect structure disposed over a semiconductor substrate, contact pads disposed on the interconnect structure, a dielectric structure disposed on the interconnect structure and covering the contact pads, bonding connectors covered by the dielectric structure and landing on the contact pads, and a dummy feature covered by the dielectric structure and laterally interposed between adjacent two of the bonding connectors. Top surfaces of the bonding connectors are substantially coplanar with a top surface of the dielectric structure, and the bonding connectors are electrically coupled to the interconnect structure through the contact pads.

20 Claims, 15 Drawing Sheets

SEMICONDUCTOR STRUCTURE COMPRISING DUMMY FEATURE INTERPOSED BETWEEN THE BONDING CONNECTORS

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. As demands for miniaturization, higher speed, greater bandwidth, lower power consumption, and reduced latency have grown, stacked semiconductor structures, e.g., three-dimensional integrated circuits (3DICs), have been developed. However, there is continuous effort in developing new mechanisms of forming 3DICs having improved electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
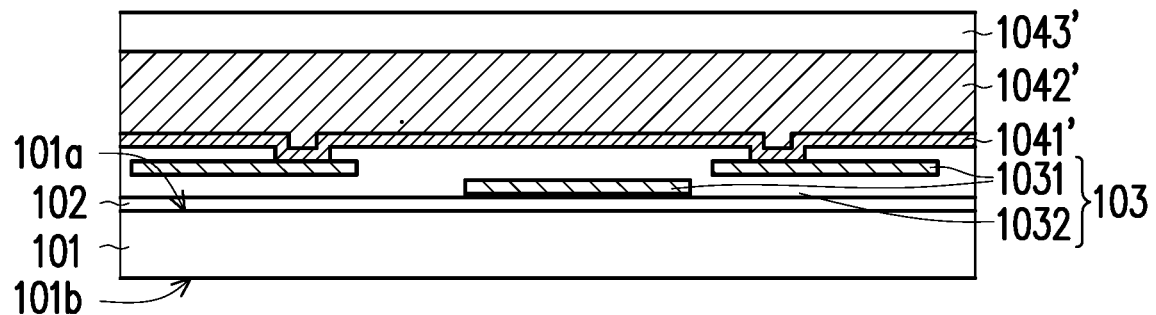
FIGS. 1A-1I are schematic cross-sectional views showing various stages in a manufacturing method of a tier of a semiconductor structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
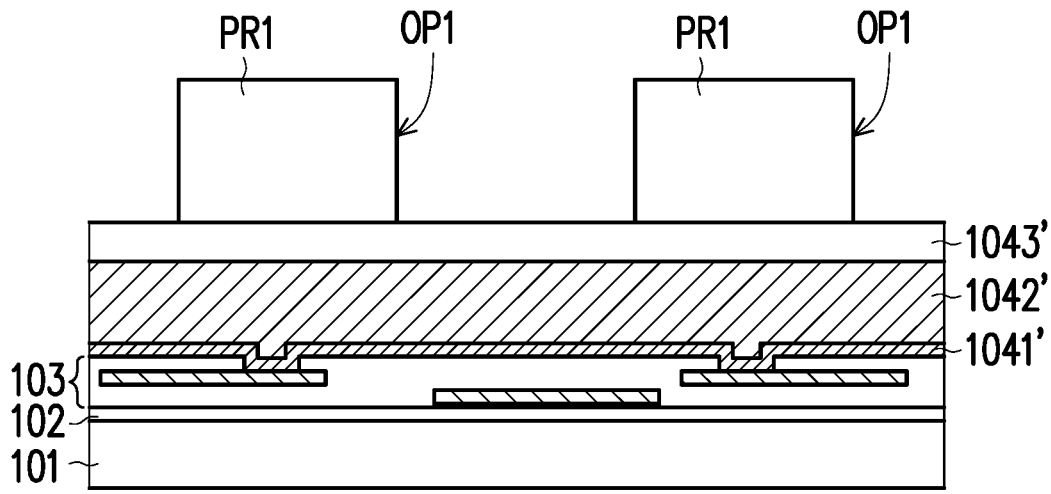
Figure 1C:
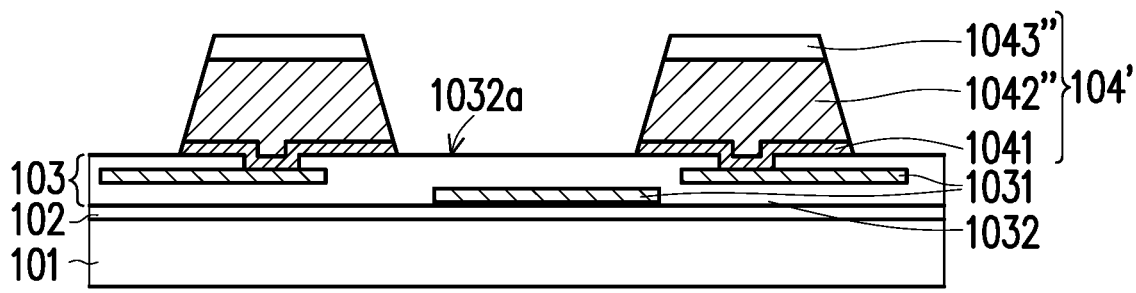
Figure 1D:
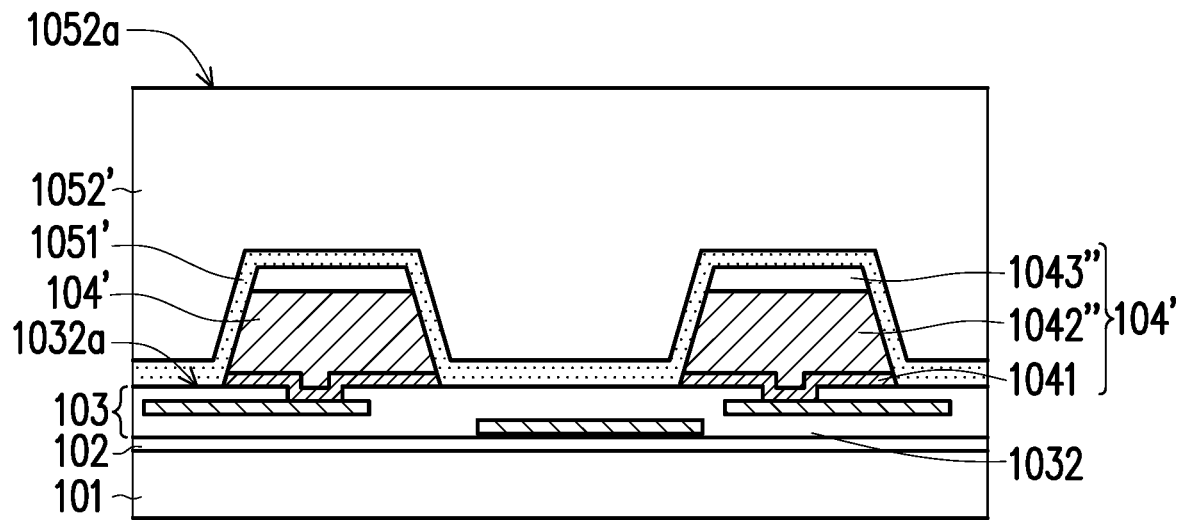
Figure 1E:
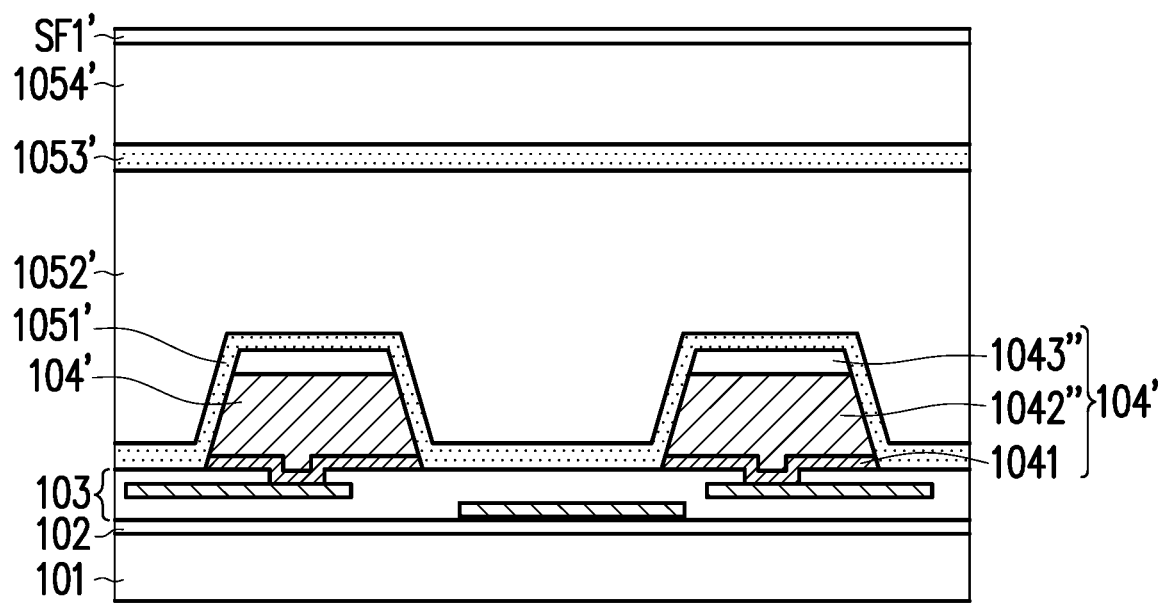
Figure 1F:
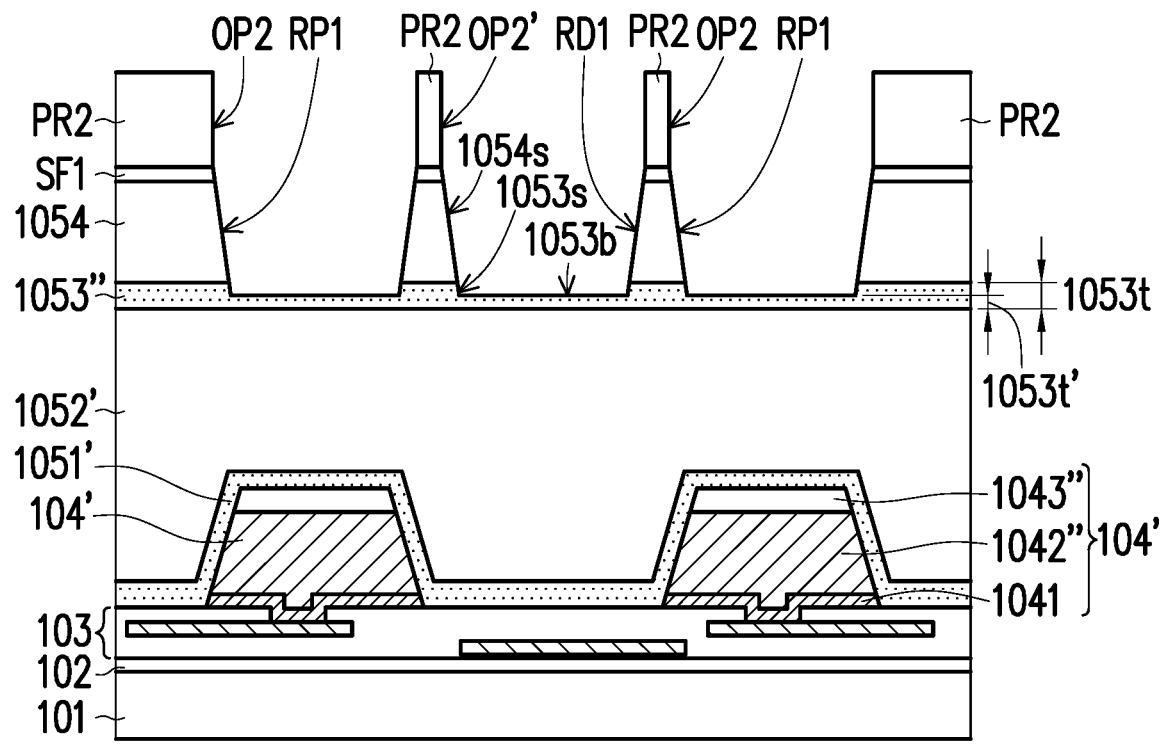
Figure 1G:
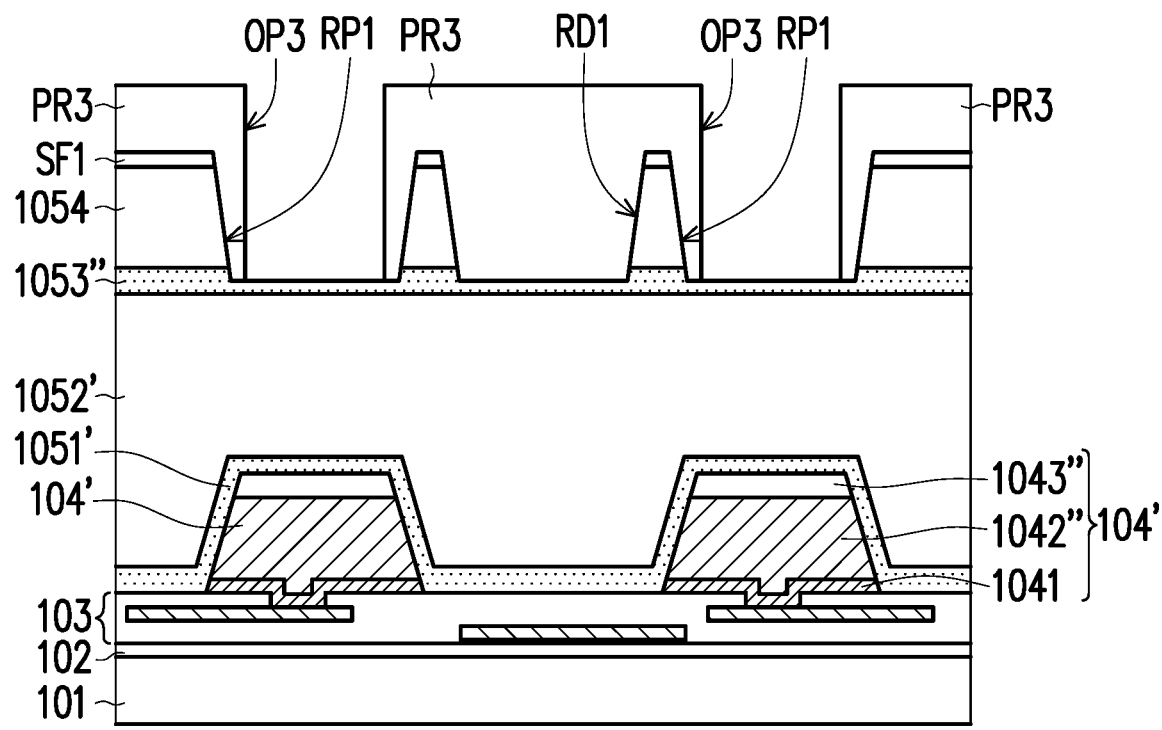
Figure 1H:
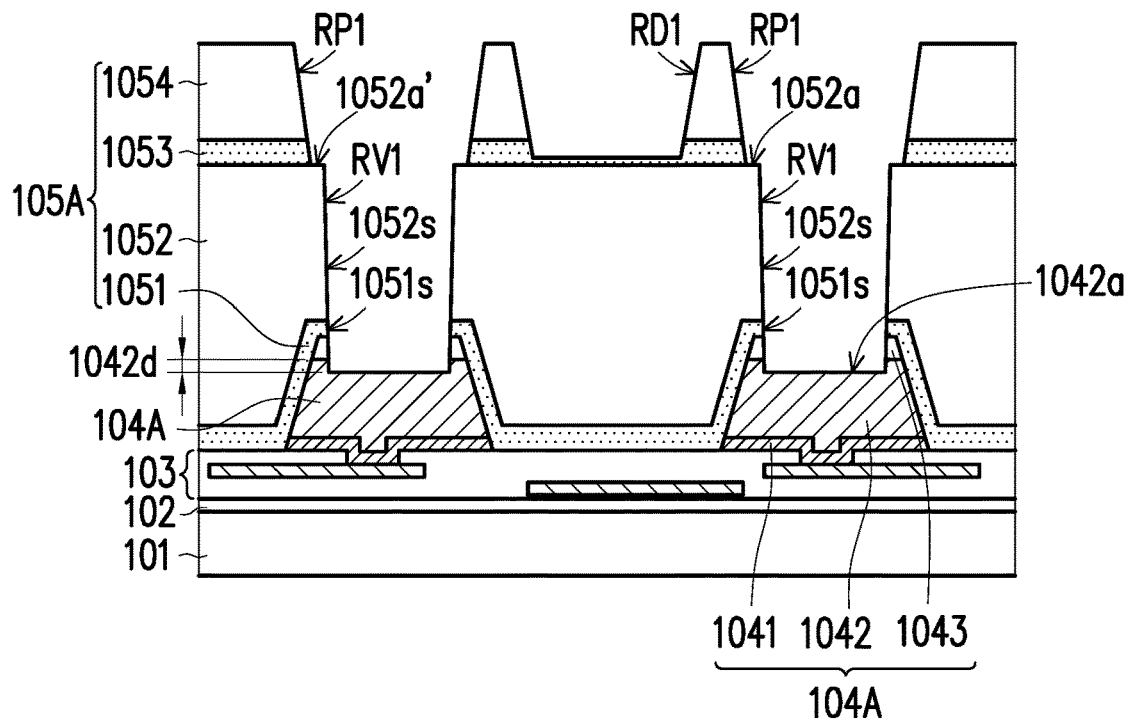
Figure 1I:
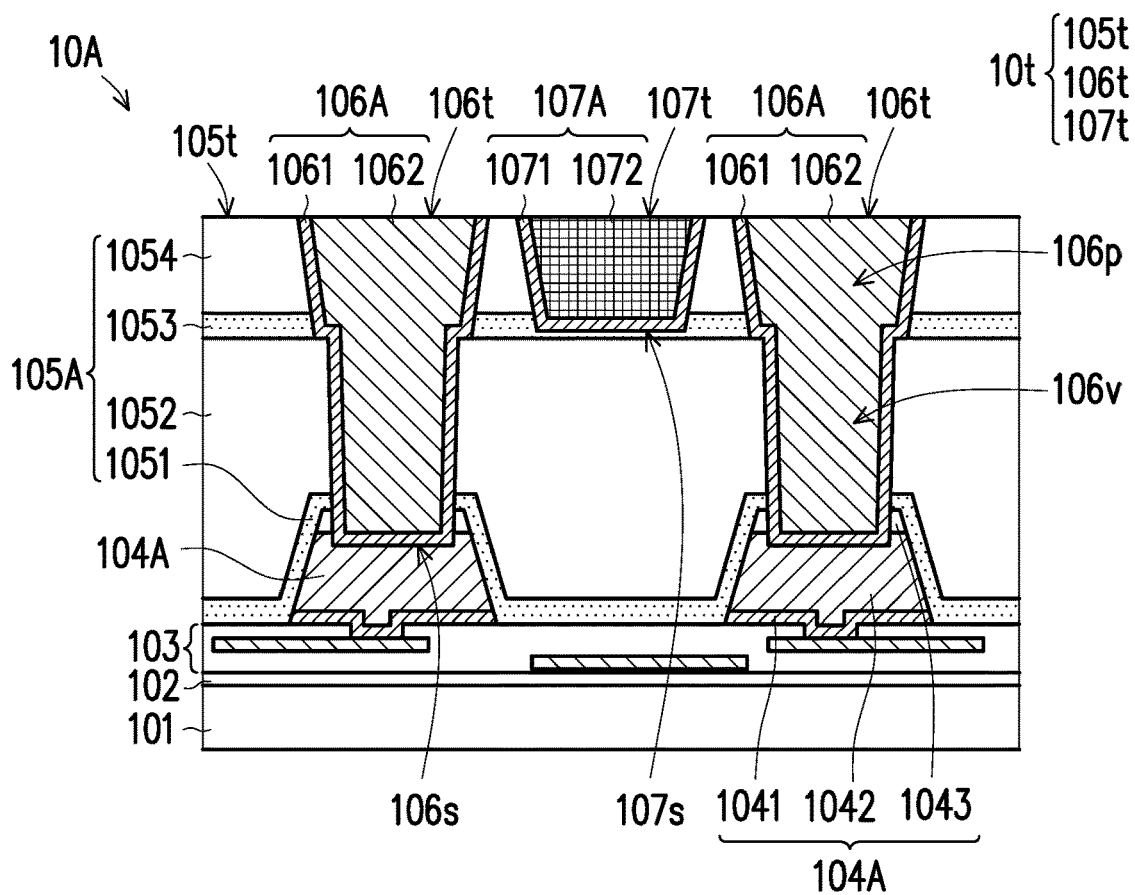
Figure 2A:
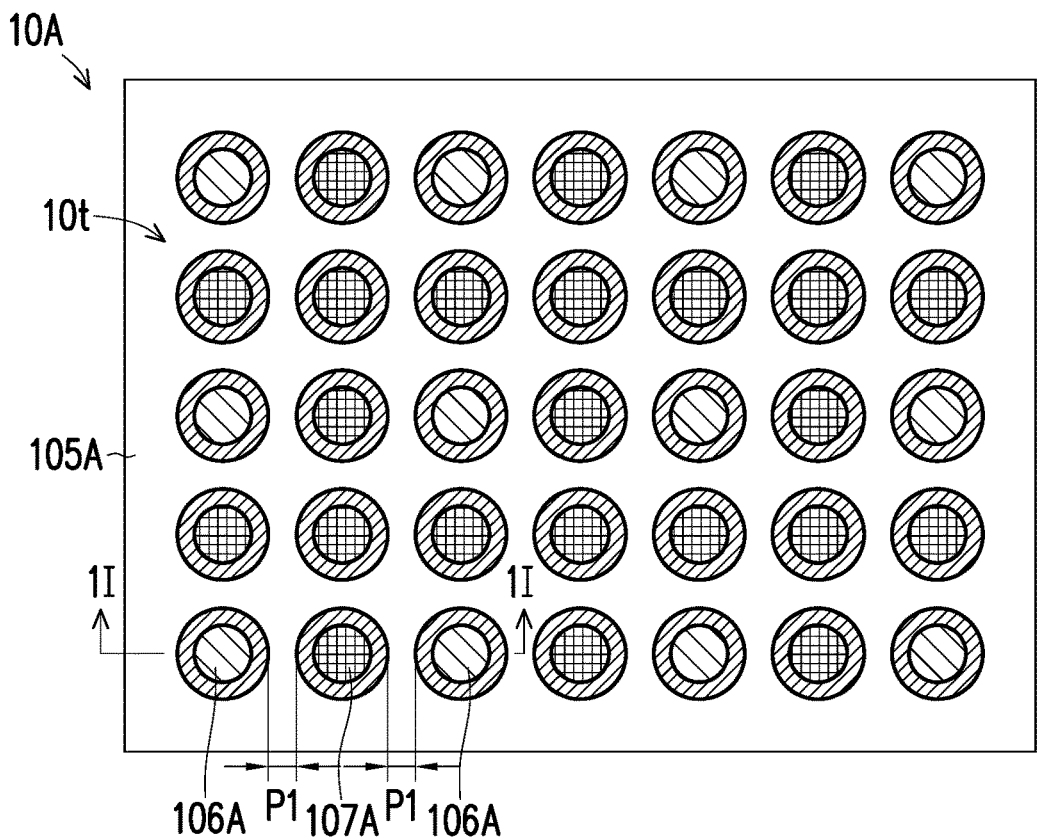
FIG. 2A is a schematic top view showing a structure of FIG. 1I according to some embodiments.

FIGS. 1A-1I are schematic cross-sectional views showing various stages in a manufacturing method of a tier of a semiconductor structure and FIG. 2A is a schematic top view showing a structure of FIG. 1I, in accordance with some embodiments. Referring to FIG. 1A, a semiconductor substrate 101 having a front side 101a and a back side 101b is provided. The semiconductor substrate 101 may include a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 101 includes an elementary semiconductor (e.g., silicon or germanium in a crystalline, a polycrystalline, or an amorphous structure, etc.), a compound semiconductor (e.g., SiC, GaAs, GaP, InP, InAs, InSb, etc.), an alloy semiconductor (e.g., SiGe, GaAsP, AlInAs, AlGaAs, GaInAs, GaInP, etc.), combinations thereof, or other suitable materials.

In some embodiments, a device layer 102 including semiconductor devices (not individually illustrated) is formed on the front side 101a of the semiconductor substrate 101. The semiconductor devices in the device layer 102 may be or may include active devices (e.g., transistors, diodes, etc.) and/or passive devices (e.g., capacitors, resistors, inductors, etc.), or other suitable electrical components. In some embodiments, an interconnect structure 103 including interconnecting layers 1031 embedded in a dielectric layer 1032 is formed over the front side 101a of the semiconductor substrate 101. The dielectric layer 1032 overlying the device layer 102 may cover the semiconductor devices, and may be formed of a low-K dielectric material, such as phosphosilicate glass (PSG), borophosphosilicate glass (BPSG), SiOC, Spin-On-Glass, compounds thereof, composites thereof, combinations thereof, or the like. A material of the interconnecting layers 1031 may include copper or copper alloys, although other metals (e.g., aluminum, silver, gold, and combinations thereof) may also be used. The interconnecting layers 1031 may include conductive lines, conductive pads, conductive vias, etc., and may electrically couple the semiconductor devices to one another and to external components. Portions of the interconnecting layers 1031 may be accessibly revealed by openings of the dielectric layer 1032 for further electrical connection.

With continued reference to FIG. 1A, a diffusion barrier material 1041', a metal pad material 1042', and a capping material 1043' may be sequentially formed on the interconnect structure 103. In some embodiments, the diffusion barrier material 1041' is conformally formed on the top surface of the dielectric layer 1032 and extends into the openings of the dielectric layer 1032 to be in direct contact with the interconnecting layers 1031. The diffusion barrier material 1041' may include Ti, TiN, Ta, TaN, the like, or multi-layers thereof, and may be formed by atomic layer deposition (ALD), physical vapor deposition (PVD), chemical vapor deposition (CVD), or the like. The metal pad material 1042' may be deposited on the diffusion barrier material 1041' and may fill the openings of the dielectric layer 1032 by any suitable deposition method such as PVD, CVD, or the like. The metal pad material 1042' may include copper, aluminum, nickel, tungsten, AlCu, or the like. The capping material 1043' may be deposited on the metal pad material 1042' by any suitable deposition method such as ALD, PVD, CVD, or the like, and may include SiON, SiOC, SiOCN, or the like, or multi-layers thereof. In some embodiments, the capping material 1043' is referred to as an anti-reflective coating (ARC) material, which includes an organic ARC material (e.g., polymer resin), an inorganic ARC material (e.g., SiON), or a combination thereof.

Referring to FIGS. 1B-1C, a first patterned mask PR1 having openings OP1 may be formed on the capping material 1043'. The first patterned mask PR1 may be a photoresist, which is patterned through a light-exposure process and a development process. The first patterned mask PR1 may be a single-layer mask or may include a plurality of layers such as a tri-layer. In some embodiments, the capping material 1043' is used to reduce the reflection during the light-exposure process for patterning the overlying first patterned mask PR1. The first patterned mask PR1 may be used to define areas for contact pads, and the other area which is exposed by the openings OP1 of the first patterned mask PR1 may be removed. For example, one or more dry etching process may be performed by using the first patterned mask PR1 as an etching mask to remove exposed portions of the capping material 1043', the metal pad material 1042', and the diffusion barrier material 1041', so as to expose the top surface 1032a of the dielectric layer 1032. In some embodiments, a wet etching process may be applied alone or in a combination with the dry etching process. The first patterned mask PR1 is then removed, and the resulting structure is shown in FIG. 1C.

As shown in FIG. 1C, a plurality of contact pads 104' is formed on the interconnect structure 103 and electrically coupled to the interconnecting layers 1031. The respective contact pad 104' may include the capping material layer 1043", the metal pad material layer 1042" underlying the capping material layer 1043", and the diffusion barrier layer 1041 underlying the metal pad material layer 1042". The capping material layer 1043" may (or may not) be removed before the subsequent process depending on process and product requirements. The contact pad 104' may have a tilted sidewall 104s. For example, the cross-sectional profile of the contact pad 104' over the interconnect structure 103 is of a substantially trapezoidal. It should be noted that depending on the applied removal process, the contact pad 104' may have any suitable shape.

Referring to FIG. 1D, a first etch stop material 1051' and a first dielectric material 1052' may be sequentially formed on the interconnect structure 103 to bury the contact pads 104'. For example, the first etch stop material 1051' is conformally formed on the interconnect structure 103 and the contact pads 104' by any suitable deposition method such as PVD, CVD, or the like. The first etch stop material 1051' may cover the top surface 1032a of the dielectric layer 1032, and the sidewalls and the top surfaces of the contact pads 104'. The first etch stop material 1051' may include SiN, while other materials (e.g., $Al_2O_3$, AlN, SiON, SiOC, SiOCN, or the like) may be used. Next, the first dielectric material 1052' may be formed on the first etch stop material 1051'. The first dielectric material 1052' may be or may include silicon oxide, while other materials such as undoped silicate glass, SiN, SiON, SiOC, SiOCN, or the like, may be used. In some embodiments, the first dielectric material 1052' is formed by conformally depositing a dielectric material on the first etch stop material 1051', and performing a planarization process (e.g., chemical mechanical polishing (CMP), grinding, etching, a combination thereof, or the like) on the dielectric material to form the first dielectric material 1052' with a planar top surface 1052a. The first dielectric material 1052' may be referred to as a planarization layer.

Referring to FIG. 1E, a second etch stop material 1053' and a second dielectric material 1054' may be sequentially formed on the first dielectric material 1052'. The material of the second etch stop material 1053' may be the same as (or similar to) that of the first etch stop material 1051', and the material of the second dielectric material 1054' may be the same as (or similar to) that of the first dielectric material 1052'. In some embodiments, one or more etch stop material and dielectric material may be alternately deposited on the second dielectric material 1054'. Alternatively, the second etch stop material 1053' and the second dielectric material 1054' are omitted. It should be noted that the number of layers of etch stop material and the number of layers of dielectric material may vary depending on process and product requirements. In some embodiments, a sacrificial material SF1' is formed on the second dielectric material 1054'. The sacrificial material SF1' may include ARC material (e.g., SiON, SiOC, SiOCN, or the like) for reducing the reflection during the subsequent light-exposure process.

Referring to FIG. 1F and with reference to FIG. 1D, a second patterned mask PR2 having first openings OP2 and second openings OP2' may be formed on the sacrificial material SF1'. The second patterned mask PR2 may be a photoresist, which is patterned through a light-exposure process and a development process. The first openings OP2 of the second patterned mask PR2 may be used to define pad holes for pad portions of bonding connectors. Although only one second opening OP2' is shown FIG. 1F, the number of the second openings OP2' construes no limitation in the disclosure. The second patterned mask PR2 may be used to define dummy features. For example, the first openings OP2 are formed right above the contact pads 104', while the second openings OP2' do not overlap the contact pads 104'. Each of the second openings OP2' may be formed between two adjacent first openings OP2. Once the second patterned mask PR2 is formed, one or more etching process may be performed by using the second patterned mask PR2 as an etching mask to remove exposed portions of the sacrificial material SF1', the second dielectric material 1054', and second etch stop material 1053'. The etching processes may be performed through dry etching processes, where the etching gases are selected according to the materials of the sacrificial material SF1', the second dielectric material 1054', and the second etch stop material 1053'.

The sacrificial material SF1' and the second dielectric material 1054' may be etched through to respectively form a sacrificial pattern SF1 and a second dielectric layer 1054. A portion of the second etch stop material 1053' underlying the second dielectric material 1054' is etched to form a second etch stop material layer 1053". The second etch stop material 1053' may (or may not) be etched through. For example, a portion of the second etch stop material layer 1053" underlying the second dielectric layer 1054 has a major thickness 1053t, and another portion of the second etch stop material layer 1053" exposed by the first recesses RP1 and/or the second recesses RD1 has a minor thickness 1053t'. The bottom surface 1053b of the second etch stop material layer 1053" may be accessibly exposed. For example, the first recesses RP1 defined by the sacrificial pattern SF1, the second dielectric layer 1054, and the second etch stop material layer 1053" are formed above the contact pads 104', while second recesses RD1 defined by the sacrificial pattern SF1, the second dielectric layer 1054, and the second etch stop material layer 1053" are formed between two adjacent first recesses RP1 as shown in the cross-sectional view of FIG. 1F. Once the first recesses RP1 and the second recesses RD1 are formed, the second patterned mask PR2 is then removed through any suitable process.

Referring to FIG. 1G and with reference to FIG. 1F, a third patterned mask PR3 having openings OP3 may be formed on the sacrificial pattern SF1 and may extend into the first recesses RP1 and the second recesses RD1. The third patterned mask PR3 may be a photoresist, which is patterned through a light-exposure process and a development process. The third patterned mask PR3 may fill the second recesses RD1 for protection. The openings OP3 of the third patterned mask PR3 may be used to define via holes for via portions of bonding connectors. For example, each of the openings OP3 corresponds to one of the first recesses RP1. A portion of the third patterned mask PR3 may extend into the respective first recess RP1 to cover the bottom surface 1053b of the second etch stop material layer 1053" and the sidewalls of the sacrificial pattern SF1, the second dielectric layer 1054, and the second etch stop material layer 1053".

Referring to FIG. 1H and with reference to FIG. 1G, via holes RV1 connected to the first recesses RP1 may be formed by using the third patterned mask PR3. Once the via holes RV1 are formed, the third patterned mask PR3 is then removed to accessibly reveal the first recesses RP1 and the second recesses RD1 through any suitable process. For example, one or more etching process (e.g., dry etching, wet etching, a combination thereof, or the like) may be performed by using the third patterned mask PR3 as an etching mask to remove exposed portions of the second etch stop material layer 1053", the underlying first dielectric material 1052', and the underlying first etch stop material 1051' to respectively form a second etch stop layer 1053, a first dielectric layer 1052, and a first etch stop layer 1051. The via holes RV1 may be tapered toward the semiconductor substrate 101. For example, the first dielectric layer 1052 and the first etch stop layer 1051 have tilted sidewalls 1052s and 1051s. In some embodiments, during the removal of the third patterned mask PR3, a portion of the second etch stop material layer 1053" that is directly covered by the third patterned mask PR3 is removed so as to accessibly expose the top surface 1052a' of the first dielectric layer 1052. The first etch stop layer 1051, the overlying first dielectric layer 1052, the overlying second etch stop layer 1053, and the overlying second dielectric layer 1054 may be collectively viewed as a dielectric structure 105A.

During the etching processes, a portion of the capping material layer 1043" of the respective contact pad 104' may be removed to form a capping layer 1043. In some embodiments, a portion of the metal pad material layer 1042" underlying the portion of the capping material layer 1043" is also etched to form a metal pad layer 1042 having a recessed top surface 1042a. The recessed top surface 1042a accessibly exposed by the corresponding via hole RV1 may have a recess depth 1042d, where the recess depth 1042d is non-zero. The value of the recess depth 1042d may vary depending on process variations. The capping layer 1043, the underlying metal pad layer 1042, and the underlying diffusion barrier layer 1041 may be collectively viewed as a contact pad 104A.

Referring to FIG. 1I and with reference to FIG. 1H, bonding connectors 106A may be formed in the first recesses RP1 and the via holes RV1 to be physically and electrically connected to the contact pads 104A, while dummy features 107A may be formed in the second recesses RD1. The respective bonding connector 106A may include a diffusion barrier layer 1061 and a metallic layer 1062, where the diffusion barrier layer 1061 may be conformally formed in the corresponding first recess RP1 and the underlying via hole RV1, and the metallic layer 1062 overlying the diffusion barrier layer 1061 fills the rest space in the first recess RP1 and the via hole RV1. The respective dummy feature 107A may include a diffusion barrier layer 107I conformally formed in the second recess RD1, and a metallic layer 1072 overlying the diffusion barrier layer 107I and filling the second recess RD1.

In some embodiments, a diffusion barrier material layer and a metallic material layer are sequentially formed in the first recesses RP1 and the via holes RV1 and also sequentially formed in the second recesses RD1. The diffusion barrier material layer may be formed of or include Ti, TiN, Ta, TaN, or the like, and may be formed by PVD or any suitable deposition process. The metallic material layer may include copper, copper alloy, or the like, and may be formed by a plating process or any suitable deposition process. In some embodiments, a planarization process (e.g., CMP, grinding, etching, and/or the like) is performed to remove excess portions of the diffusion barrier material layer and the metallic material layer, resulting in the bonding connectors 106A and the dummy features 107A. For example, after the planarization process, the top surfaces 106t of the bonding connectors 106A and the top surfaces 107t of the dummy features 107A are substantially leveled (or coplanar) with the top surface 105t of the dielectric structure 105A. Up to here, the fabrication of a tier 10A of a semiconductor structure is substantially complete.

In some embodiments, the aforementioned processes are performed in the wafer level, and the tier 10A is ready to perform the subsequent bonding process as will be described in FIG. 9. The top surface 105t of the dielectric structure 105A, the top surfaces 106t of the bonding connectors 106A, and the top surfaces 107t of the dummy features 107A may be collectively viewed as a bonding surface 10t of the tier 10A. In some embodiments, a singulation process is performed to cut through the dielectric structure 105A, the underlying interconnect structure 103, and the underlying semiconductor substrate 101 to form a plurality of tiers 10A. Those tiers 10A may serve as die components that are to be bonded to another tier so as to form a semiconductor structure as will be described in FIG. 9.

As shown in FIG. 1I, the bonding connectors 106A may be connected to the contact pads 104A with a one-to-one correspondence. In alternative embodiments, more than one bonding connector 106 may land on a respective contact pad 104A. The respective bonding connector 106A includes a pad portion 106p and a via portion 106v connected to the pad portion 106p and the corresponding contact pad 104A, where the pad portion 106p is laterally covered by the second dielectric layer 1054 and the second etch stop layer 1053, and the via portion 106v is laterally covered by the first dielectric layer 1052, the first etch stop layer 1051, and a top portion of the corresponding contact pad 104A. In some embodiments, the bottom end of the via portion 106v of the bonding connector 106A is inserted into the corresponding contact pad 104A, where the capping layer 1043 and the underlying metal pad layer 1042 laterally cover the bottom end of the respective bonding connector 106A, and the bottom surface 106s of the respective bonding connector 106A is directly engaged with the recessed top surface of the metal pad layer 1042. Each dummy feature 107A is laterally interposed between and spaced apart from two adjacent bonding connectors 106A. The bottom surface 107s of the dummy feature 107A may be in direct contact with the second etch stop layer 1053 of the dielectric structure 105A. The dielectric structure 105A laterally covering the bonding connectors 106A and the dummy feature 107A may separate the bonding connectors 106A from one another and also separate the dummy feature 107A from the bonding connectors 106A.

Referring to FIG. 2A and with continued reference to FIG. 1I, FIG. 2A illustrates a top view of the tier 10A, where the cross-sectional view illustrated in FIG. 1I is obtained from the plane containing line 1I-1I in FIG. 2A. The bonding connectors 106A in the top view may have a circular shape. Although other shapes (e.g., a rectangular shape, a square shape, a polygonal shape, an oval shape, etc.) may be used. The top-view shape of the bonding connectors 106A may depend on the design requirements, and is not intended to be limiting in the disclosure. In some embodiments, the dummy features 107A have the same (or similar) top-view shape as the bonding connectors 106A. In the top view, the bonding connectors 106A are arranged as an array throughout the bonding surface 10t of the tier 10A, where the array has n number of columns and m number of rows. The bonding connectors 106A electrically coupled to the interconnect structure 103 through the contact pads 104A may be referred to as active connectors, and the region the bonding connectors 106A are located on may be referred to as an active region.

The dummy features 107A may be distributed within the array of the bonding connectors 106A and inserted into each row and each column in the active region. In the middle of the active region, a respective bonding connector 106A may be surrounded by the dummy features 107A. In some embodiments, the bonding connectors 106A and the dummy features 107A are interleaved with one another so that two dummy features 107A are inserted in a set of three consecutive bonding connectors 106A in each row/column. A respective dummy feature 107A may be spaced apart from the most adjacent one of the bonding connectors 106A by a shortest lateral distance P1, where the shortest lateral distance P1 is non-zero. The value of the shortest lateral distance P1 may vary depending on the process capability of the technology node. In some embodiments, a respective dummy feature 107A interposed between two adjacent bonding connectors 106A is substantially equidistant from these two adjacent bonding connectors 106A, within process variations.

Figure 2B:
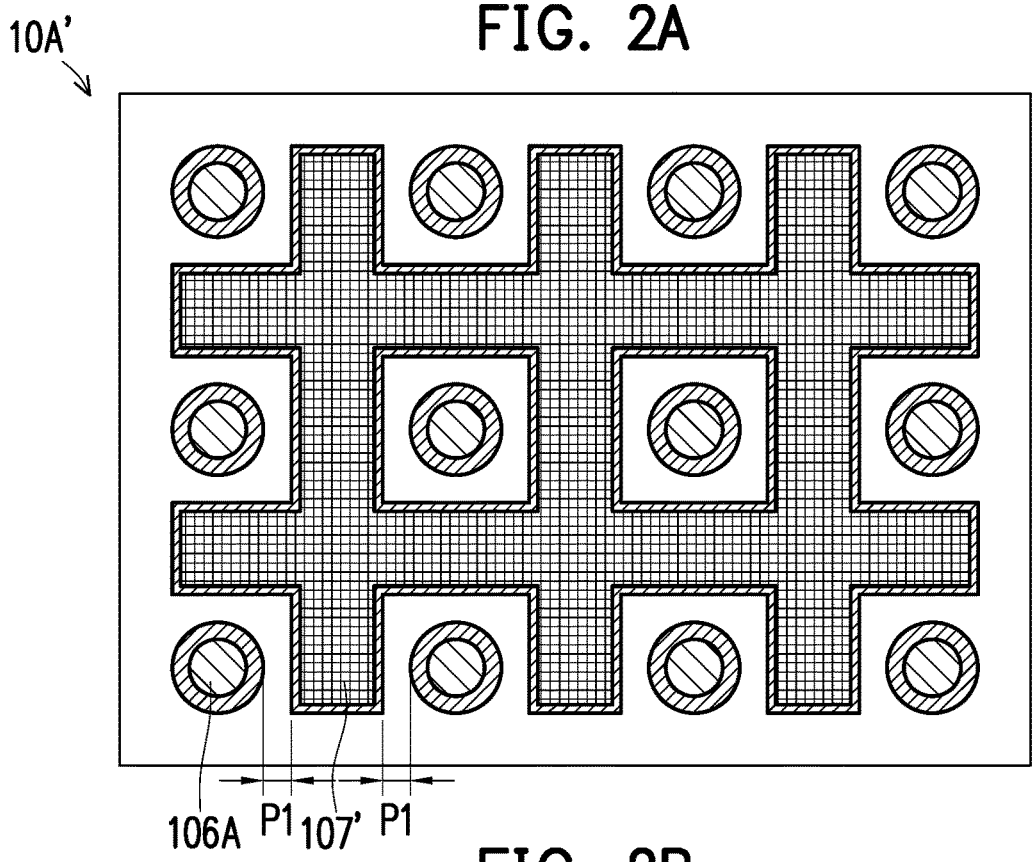
FIG. 2B is a schematic top view showing a configuration of bonding connectors and dummy features according to some embodiments.

FIG. 2B is a schematic top view showing a configuration of bonding connectors and dummy features according to some embodiments. A tier 10A' of a semiconductor structure shown in FIG. 2B is similar to the tier 10A illustrated in FIG. 2A, and like elements are designated with the same reference numbers for ease of understanding and the details thereof are not repeated herein. Referring to FIG. 2B and with reference to FIG. 2A, the difference between the tiers 10A' and 10A is the configuration of the dummy feature 107'.

The dummy feature 107' of the tier 10A' may be a mesh structure which includes a plurality of strips interleaved with one another, and the bonding connectors 106A may be distributed in the blank areas of the mesh structure. In some embodiments, the strips of the dummy feature 107' are of a rectangular top-view shape, and the top-view shape of the blank areas of the mesh structure may be rectangular or square. In the middle of the active region, a respective bonding connector 106A within one of the blank areas may be encircled by the strips of the dummy feature 107'. A respective strip of the dummy feature 107' may be spaced apart from the most adjacent one of the bonding connectors 106A by the shortest lateral distance P1. The strips of the dummy feature 107' interposed between two adjacent columns/rows of the bonding connectors 106A may be substantially equidistant from these two adjacent columns/rows of the bonding connectors 106A, within process variations. It should be noted that the shape of the dummy feature may vary, for example, in width, thickness, and/or length, from the as drawn or designed shape.

Figure 3A:
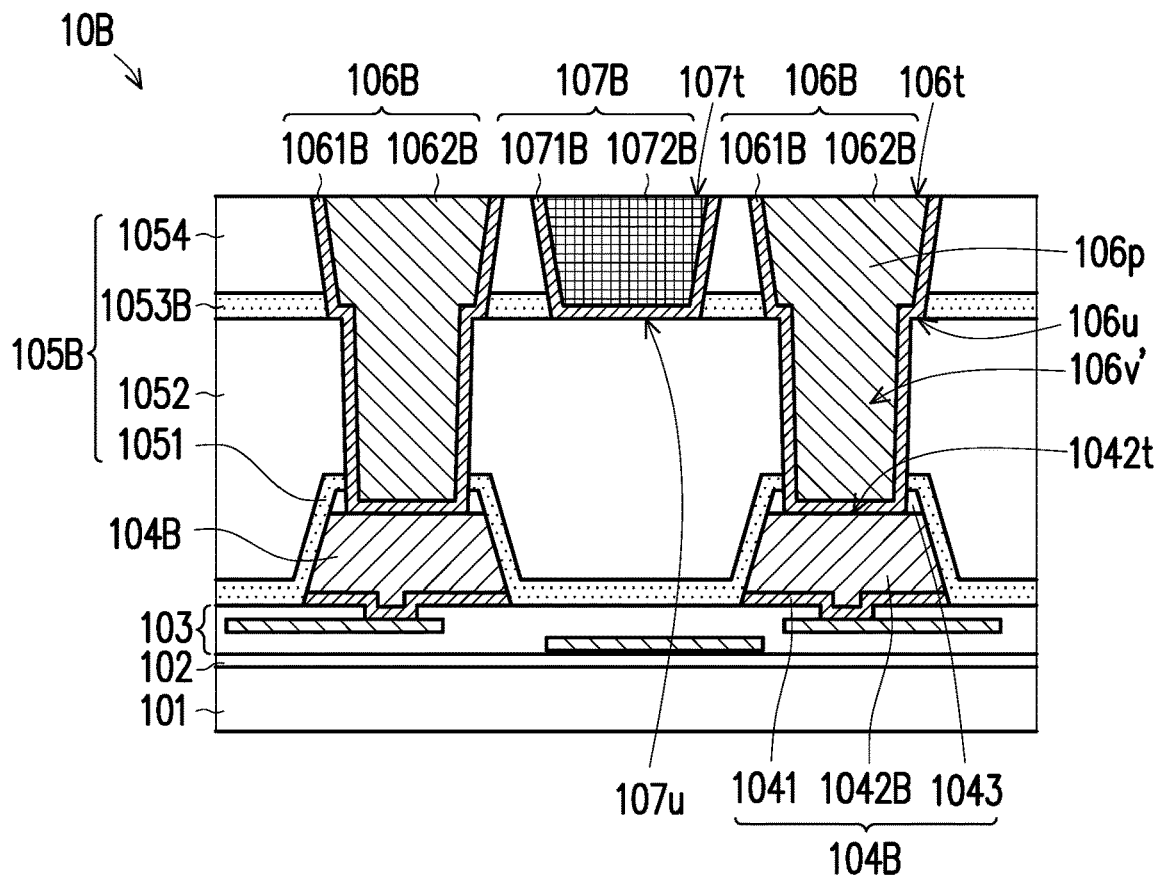
FIGS. 3A-3B are schematic cross-sectional views showing variations of a tier of a semiconductor structure according to some embodiments.
Figure 3B:
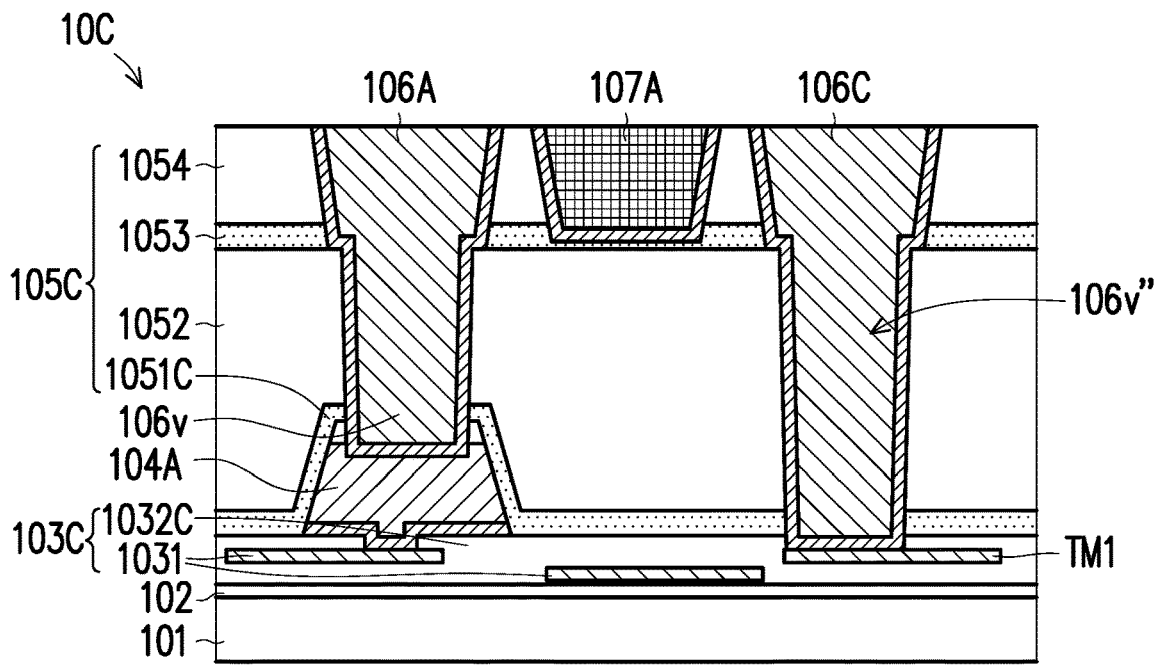

FIGS. 3A-3B are schematic cross-sectional views showing variations of a tier of a semiconductor structure according to some embodiments. Tiers 10B and 10C shown in FIGS. 3A and 3B are similar to the tier 10A illustrated in FIG. 1I, and like elements are designated with the same reference numbers for ease of understanding and the details thereof are not repeated herein. Referring to FIG. 3A and with reference to FIG. 1I, the difference between the tiers 10B and 10A includes the bonding connectors 106B and the underlying contact pads 104B. For example, a respective contact pad 104B includes the diffusion barrier layer 1041, a metal pad layer 1042B overlying the diffusion barrier layer 1041, and the capping layer 1043 overlying the metal pad layer 1042B, where the metal pad layer 1042B may have a substantially flat top surface 1042t. The via portion 106v' of the respective bonding connector 106B may land on the top surface 1042t of the metal pad layer 1042B. A respective bonding connector 106B may include a diffusion barrier layer 1061B and a metallic layer 1062B overlying the diffusion barrier layer 1061B, where the diffusion barrier layer 1061B is laterally covered by the capping layer 1043 and the interface between the diffusion barrier layer 1061B and the metal pad layer 1042B is substantially planar.

The tier 10B includes at least one the dummy feature 107B which penetrates through the second dielectric layer 1054 and the second etch stop layer 1053B of the dielectric structure 105B. For example, the dummy feature 107B includes the diffusion barrier layer 1071B and the overlying metallic layer 1072B, the outer sidewalls of the diffusion barrier layer 1071B are in physical contact with the second dielectric layer 1054 and the second etch stop layer 1053B, and the bottom surface 107u of the diffusion barrier layer 1071B is in physical contact with the first dielectric layer 1052 of the dielectric structure 105B. In some embodiments, the top surface 107t of the dummy feature 107B is substantially leveled (or coplanar) with the top surfaces 106t of the pad portions 106p of the bonding connectors 106B, while the bottom surface 107u of the dummy feature 107B is substantially leveled (or coplanar) with the bottom surfaces 106u of the pad portions 106p of the bonding connectors 106B. In some embodiments, a tier of a semiconductor structure includes a portion of the bonding connectors 106B, the contact pads 104B, and the dummy feature 107B shown in FIG. 3A and another portion of the bonding connectors 106A, the contact pads 104A, and the dummy feature 107A shown in FIG. 1I. Combination schemes may be formed to include different types of a tier of a semiconductor structure discussed herein, so that variations thereof may be carried out while still remaining within the scope of the claims and disclosure.

Referring to FIG. 3B and with reference to FIG. 1I, the difference between the tiers 10C and 10A includes the bonding connector 106C. For example, the bonding connector 106A lands on the contact pad 104A, while the bonding connector 106C lands on the interconnect structure 103C, where the dummy feature 107A may be laterally interposed between the bonding connectors 106A and the 106C. The via portion 106v'' of the bonding connector 106C may be longer than the via portion 106v of the bonding connector 106A. The dielectric structure 105C includes the first etch stop layer 1051C, the overlying first dielectric layer 1052, the overlying second etch stop layer 1053, and the overlying second dielectric layer 1054. The via portion 106v'' of the bonding connector 106C penetrates through the first dielectric layer 1052 and the underlying first etch stop layer 1051C of the dielectric structure 105C, and may extend further into the dielectric layer 1032C of the interconnect structure 103C to be in physical and electrical contact with one of the interconnecting layers 1031 (e.g., the topmost one of the interconnecting layers TM1 or other level of the interconnecting layers below the topmost one of the interconnecting layers).

It should be noted that the bonding connector 106A and the contact pad 104A of the tier 10C may be replaced with the bonding connector 106B and the contact pad 104B shown in FIG. 3A, and the dummy feature 107A of the tier 10C may be replaced with the dummy feature 107B shown in FIG. 3A. Combination schemes may be formed to include different types of semiconductor dies discussed herein, so that variations thereof may be carried out while still remaining within the scope of the claims and disclosure.

Figure 4A:
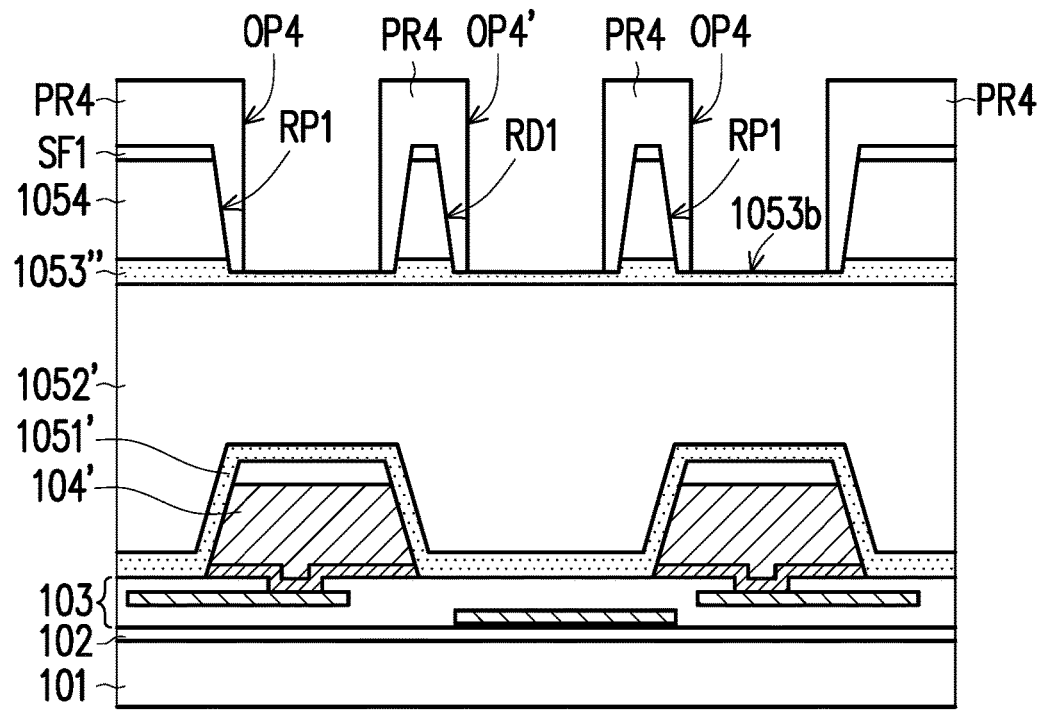
FIGS. 4A-4C are schematic cross-sectional views showing various stages in a manufacturing method of a tier of a semiconductor structure according to some embodiments.
Figure 4B:
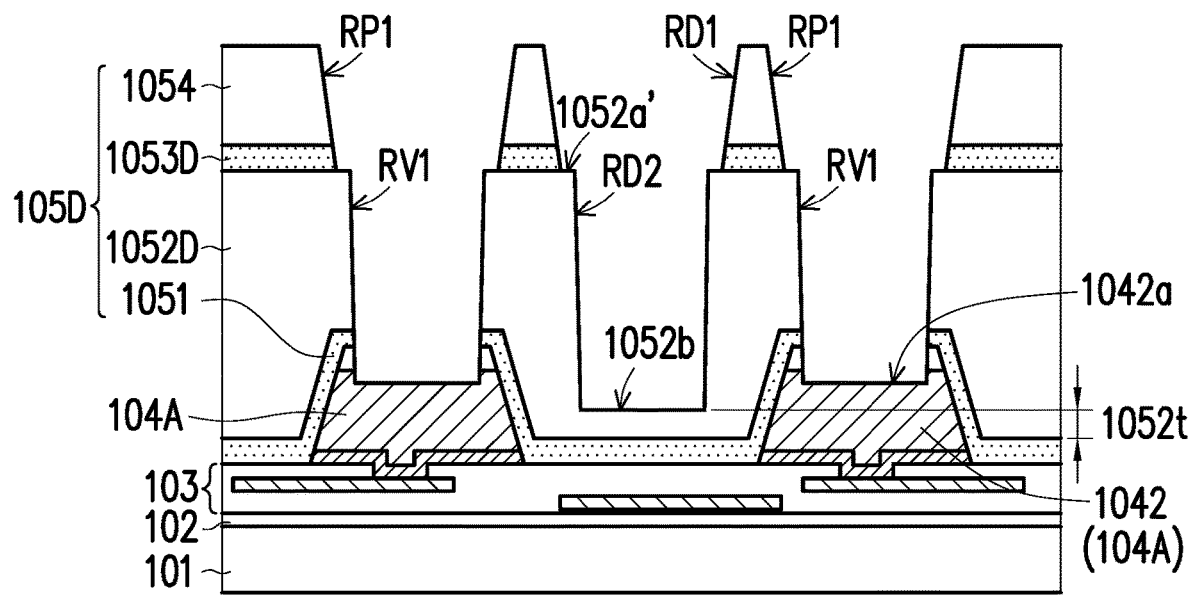
Figure 4C:
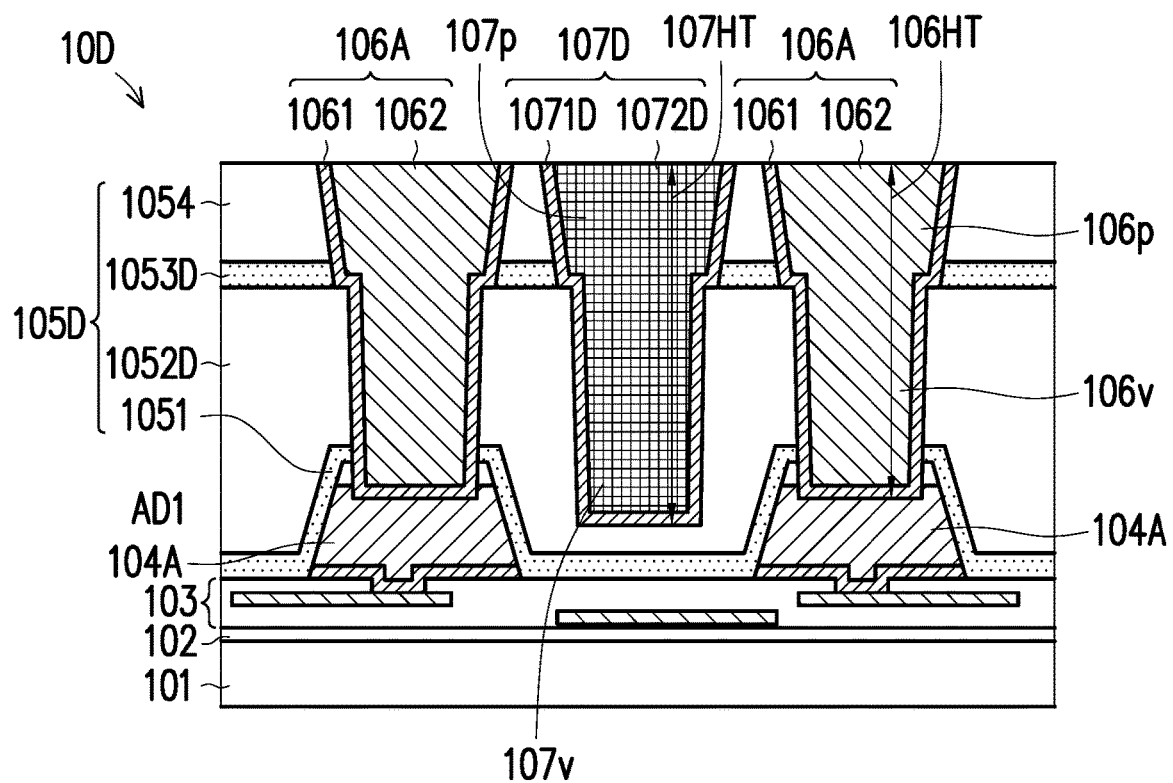

FIGS. 4A-4C are schematic cross-sectional views showing various stages in a manufacturing method of a tier of a semiconductor structure according to some embodiments. Unless specified otherwise, the materials and the formation processes of the components in these embodiments are essentially the same as the like components, which are denoted by like reference numerals in the preceding embodiments shown in FIGS. 1A-1I. The details regarding the formation processes and the materials of the components shown in the subsequent figures may thus be found in the discussion of the preceding embodiments.

Referring to FIG. 4A, the structure shown in FIG. 4A is similar to the structure shown in FIG. 1G, except that the patterned mask PR4 includes first openings OP4 and at least one second opening OP4'. For example, a portion of the patterned mask PR4 extends into the first recesses RP1 and the second recess RD1 to partially cover the bottom surface 1053b of the second etch stop material layer 1053''. The first openings OP4 may correspond to the first recesses RP1 and may be located right above the contact pads 104', and the second opening OP4' may correspond to the second recess RD1 and may be arranged between two adjacent first openings OP4.

Referring to FIG. 4B and with reference to FIG. 4A, first via holes RV1 connected to the first recesses RP1 and second via hole RD2 connected to the second recess RD1 may be formed by using the patterned mask PR4. The dielectric structure 105D including the first etch stop layer 1051, the overlying first dielectric layer 1052D, the overlying second etch stop layer 1053D, and the overlying second dielectric layer 1054 is then formed. Once the first via holes RV1 and the second via hole RD2 are formed, the patterned mask PR4 is then removed to accessibly reveal the first recesses RP1 and the second recess RD1. The forming process of the via holes and the removing process of the patterned mask are similar to the processes described in FIG. 1H, and thus the detailed descriptions are omitted. In some embodiments, a respective first via hole RV1 accessibly reveals the top surface 1042a of the metal pad layer 1042 of the corresponding contact pad 104A, and the second via hole RD2 accessibly reveals the surface 1052b of the first dielectric layer 1052D. For example, a portion of the first dielectric layer 1052D having a thickness 1052t is directly under the second via hole RD2, where the thickness 1052t is non-zero.

The first via holes RV1 may be tapered toward the corresponding contact pads 104A, and the second via hole RD2 may be tapered toward the same direction as the first via holes RV1. During the removal of the patterned mask PR4, a portion of the second etch stop material layer 1053'' that is directly covered by the patterned mask PR4 in the first recesses RP1 and another portion of the second etch stop material layer 1053'' that is directly covered by the patterned mask PR4 in the second recess RD1 are removed to form the second etch stop layer 1053D. The top surface 1052a' of the first dielectric layer 1052D may be accessibly exposed by both of the first recesses RP1 and the second recess RD1.

Referring to FIG. 4C and with reference to FIG. 4B, the bonding connectors 106A may be formed in the first recesses RP1 and the first via holes RV1 to be physically and electrically connected to the contact pads 104A, and a dummy feature 107D may be formed in the second recess RD1 and the second via hole RD2. The respective bonding connector 106A may include the diffusion barrier layer 1061 conformally formed in the first recess RP1 and the first via hole RV1, and the metallic layer 1062 overlying the diffusion barrier layer 1061 and filling the first recess RP1 and the first via hole RV1. Similarly, the dummy feature 107D may include a diffusion barrier layer 1071D conformally formed in the second recess RD1 and the second via hole RD2, and a metallic layer 1072D overlying the diffusion barrier layer 1071D and filling the second recess RD1 and the second via hole RD2. The forming processes of the bonding connectors and the dummy feature are similar to the processes described in FIG. 1I, and thus the detailed descriptions are omitted. Up to here, the fabrication of a tier 10D of a semiconductor structure is substantially complete.

The dummy feature 107D may have a greater height than the bonding connector 106A. In comparison, as shown in the cross-sectional view of FIG. 4C, the bottom end of the dummy feature 107D is closest to the semiconductor substrate 101 than the bottom ends of the bonding connectors 106A. For example, the respective bonding connector 106A including the pad portion 106p and the via portion 106v may have a maximum height 106HT, the dummy feature 107D including the pad portion 107p and the via portion 107v may have a maximum height 107HT, where the maximum height 107HT is greater than the maximum height 106HT. The difference AD1 of the maximum height 107HT and the maximum height 106HT may be non-zero. The value of the difference AD1 may vary depending on process variations.

Figure 5:
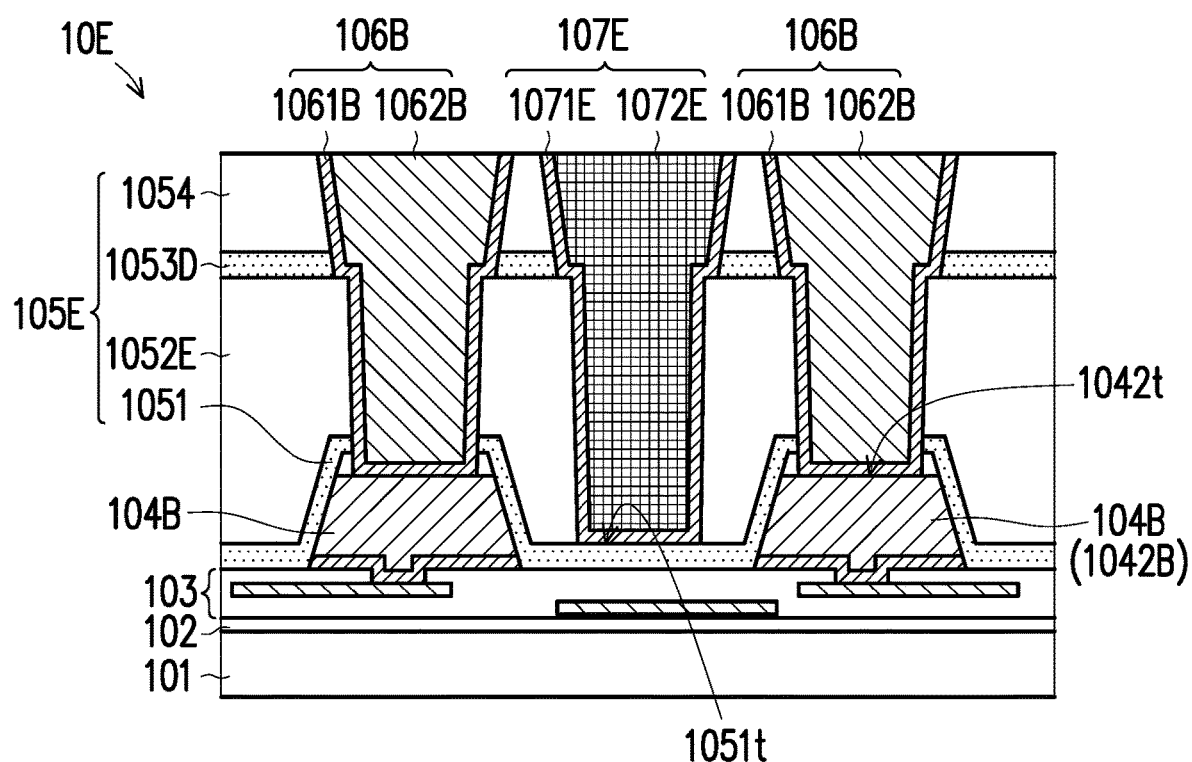
FIG. 5 is a schematic cross-sectional view showing a tier of a semiconductor structure according to some embodiments.

FIG. 5 is a schematic cross-sectional view showing a tier of a semiconductor structure according to some embodiments. A tier 10E shown in FIG. 5 is similar to the tier 10D illustrated in FIG. 4C, and like elements are designated with the same reference numbers for ease of understanding and the details thereof are not repeated herein. Referring to FIG. 5 and with reference to FIG. 4C, the difference between the tiers 10E and 10D includes the dielectric structure 105E, the bonding connectors 106B, the contact pads 104B, and the dummy feature 107E. The bonding connectors 106B and the contact pads 104B are similar to the bonding connectors 106B and the contact pads 104B shown in FIG. 3A, where the respective bonding connector 106B may land on the top surface 1042t of the metal pad layer 1042B.

The dielectric structure 105E includes the first etch stop layer 1051, the overlying first dielectric layer 1052E, the overlying second etch stop layer 1053D, and the overlying second dielectric layer 1054. The dummy feature 107E may penetrate through the first dielectric layer 1052E, the overlying second etch stop layer 1053D, and the overlying second dielectric layer 1054. The dummy feature 107E includes a diffusion barrier layer 1071E and a metallic layer 1072E overlying the diffusion barrier layer 1071E, where the bottom surface of the diffusion barrier layer 1071E is in direct contact with the top surface 1051t of the first etch stop layer 1051. It should be noted that the bonding connector 106B and the contact pad 104B of the tier 10E may be replaced with the bonding connector 106A and the contact pad 104A shown in FIG. 4C or the bonding connector 106B may be replaced with the bonding connector 106C shown in FIG. 3B. The dummy feature 107E of the tier 10E may be replaced with the dummy feature 107A shown in FIG. 1I or the dummy feature 107B shown in FIG. 3A. Combination schemes may be formed to include different types of semiconductor dies discussed herein, so that variations thereof may be carried out while still remaining within the scope of the claims and disclosure.

Figure 6A:
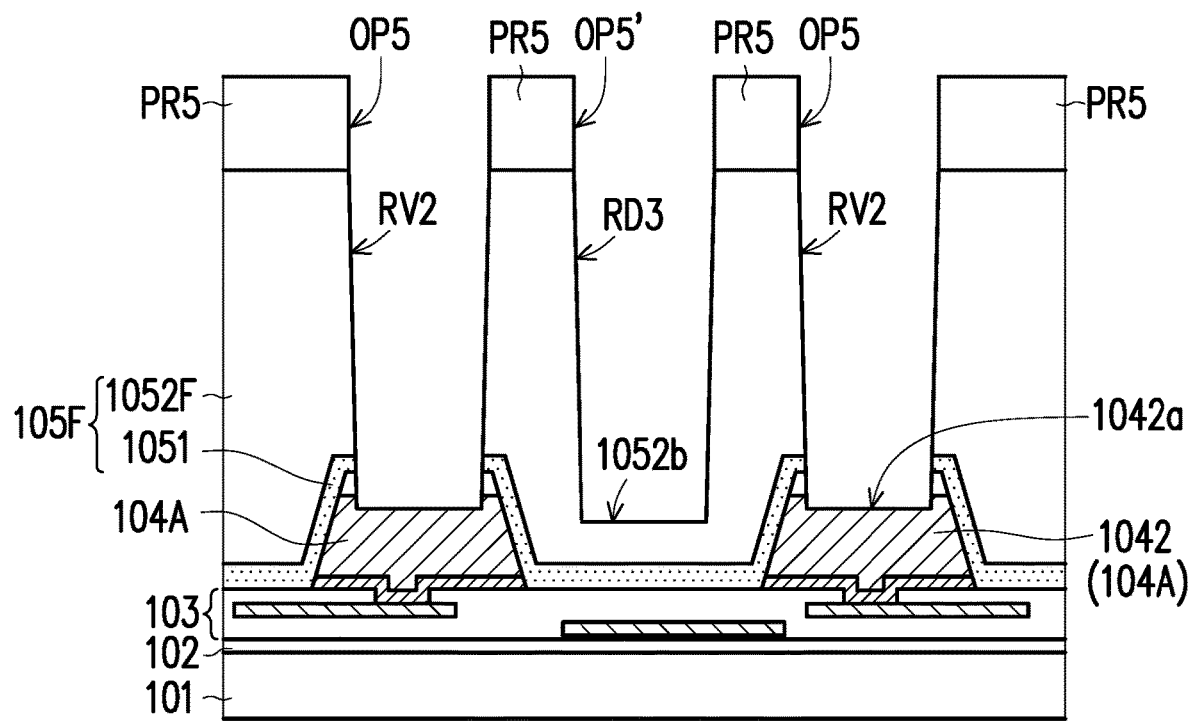
FIGS. 6A-6B are schematic cross-sectional views showing various stages in a manufacturing method of a tier of a semiconductor structure according to some embodiments.
Figure 6B:
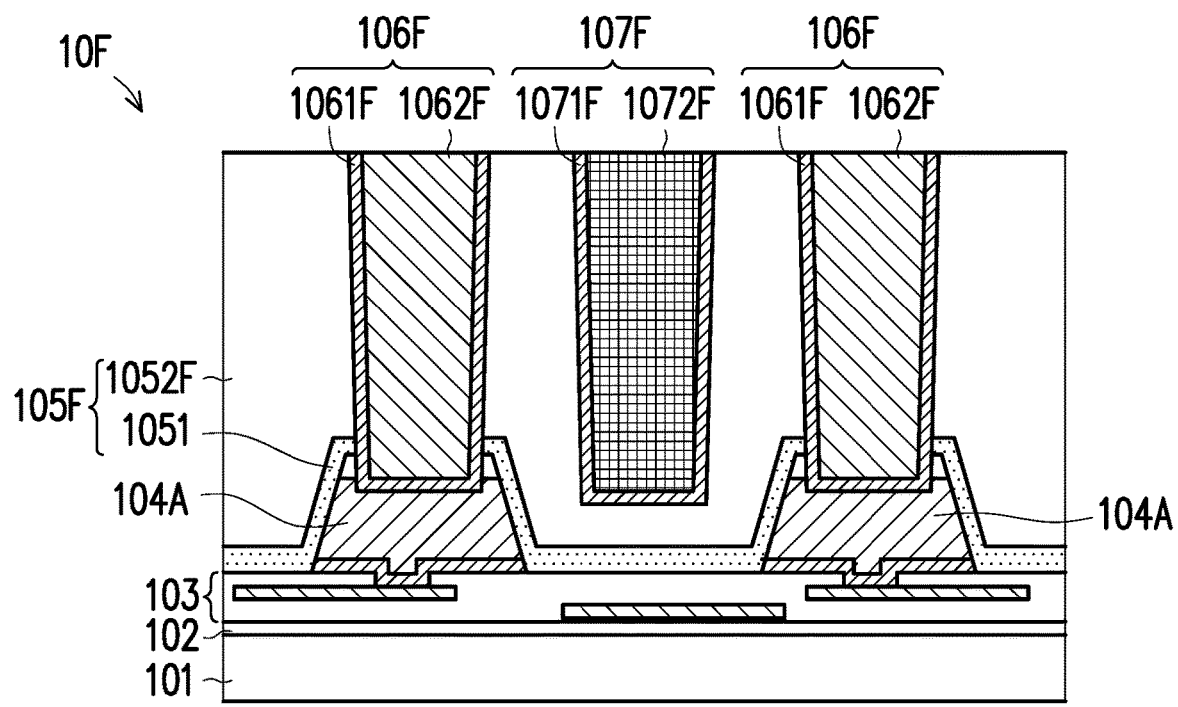

FIGS. 6A-6B are schematic cross-sectional views showing various stages in a manufacturing method of a tier of a semiconductor structure according to some embodiments. Unless specified otherwise, the materials and the formation processes of the components in these embodiments are essentially the same as the like components, which are denoted by like reference numerals in the preceding embodiments shown in FIGS. 1A-1I. The details regarding the formation processes and the materials of the components shown in the subsequent figures may thus be found in the discussion of the preceding embodiments.

Referring to FIG. 6A and with reference to FIG. 1D, after the first etch stop material 1051' and the first dielectric material 1052' are sequentially formed, a patterned mask PR5 having first openings OP5 and a second opening OP5' may be formed on the first dielectric material 1052'. A layer of sacrificial material is optionally formed on the first dielectric material 1052' before forming the patterned mask PR5 for reducing the reflection during the light-exposure process. Next, one or more etching process may be performed by using the patterned mask PR5 as an etching mask to remove portions of the first dielectric material 1052' and the underlying first etch stop material 1051' to respectively form the first dielectric layer 1052F and the first etch stop layer 1051. The first dielectric layer 1052F and the first etch stop layer 1051 may be collectively viewed as the dielectric structure 105F.

The first openings OP5 and the second opening OP5' of the patterned mask PR5 may be used to define first via holes RV2 and a second via hole RD3, respectively. The first and second via holes RV2 and RD3 may have titled sidewalls or substantially vertical sidewalls. In some embodiments, the second via hole RD3 is deeper than the respective first via hole RV2. During the etching, a portion of each contact pad 104' may be removed to form the contact pad 104A, where the respective first via hole RV2 accessibly reveals the top surface 1042a of the metal pad layer 1042 of the corresponding contact pad 104A. The second via hole RD3 may accessibly reveal the surface 1052b of the first dielectric layer 1052F.

Referring to FIG. 6B and with reference to FIG. 6A, once the first and second via holes RV2 and RD3 are formed, the patterned mask PR5 may be removed through any suitable process. Subsequently, bonding connectors 106F and a dummy feature 107F may be respectively formed in the first and second via holes RV2 and RD3. For example, the diffusion barrier layer 1061F and the diffusion barrier layer 1071F are respectively and conformally formed in the first via holes RV2 and the second via hole RD3, and then the metallic layer 1062F and the metallic layer 1072F respectively fill the first via holes RV2 and the second via hole RD3. Up to here, the fabrication of a tier 10F of a semiconductor structure is substantially complete.

FIGS. 7A-7G are schematic cross-sectional views showing various stages in a manufacturing method of a tier of a semiconductor structure according to some embodiments. Unless specified otherwise, the materials and the formation processes of the components in these embodiments are essentially the same as the like components, which are denoted by like reference numerals in the preceding embodiments shown in FIGS. 1A-1I. The details regarding the formation processes and the materials of the components shown in the subsequent figures may thus be found in the discussion of the preceding embodiments.

Figure 7A:
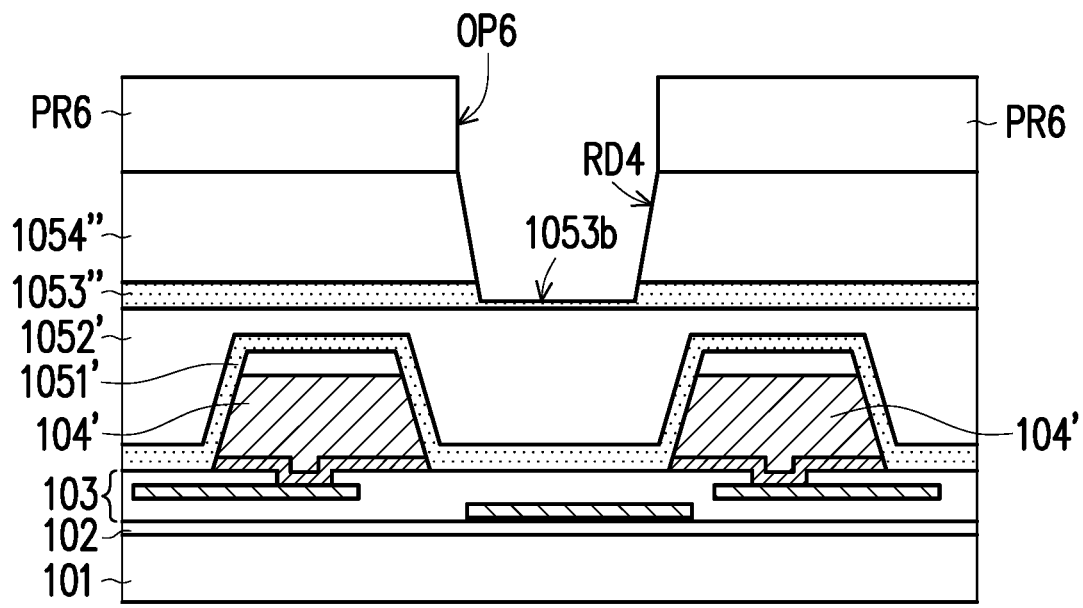
FIGS. 7A-7G are schematic cross-sectional views showing various stages in a manufacturing method of a tier of a semiconductor structure according to some embodiments.

Referring to FIG. 7A and with reference to FIG. 1E, the first etch stop material 1051', the first dielectric material 1052', the second etch stop material 1053', and the second dielectric material 1054' are sequentially formed over the interconnect structure 103 to cover the contact pads 104'. A first patterned mask PR6 having an opening OP6 may be formed on the second dielectric material 1054'. The first patterned mask PR6 may be a photoresist, which is patterned through a light-exposure process and a development process. A layer of sacrificial material is optionally formed on the second dielectric material 1054' before forming the first patterned mask PR6 for reducing the reflection during the light-exposure process. Next, one or more etching process may be performed by using the first patterned mask PR6 as an etching mask. The openings OP6 of the first patterned mask PR6 may be used to define the area for forming the dummy feature. For example, a portion of the second dielectric material 1054' and a portion of the second etch stop material 1053' underlying the portion of the second dielectric material 1054' are removed to form the recess RD4 which is defined by the second dielectric material layer 1054" and the second etch stop material layer 1053". The bottom surface 1053b of the second etch stop material layer 1053" may be accessibly exposed by the recess RD4.

Figure 7B:
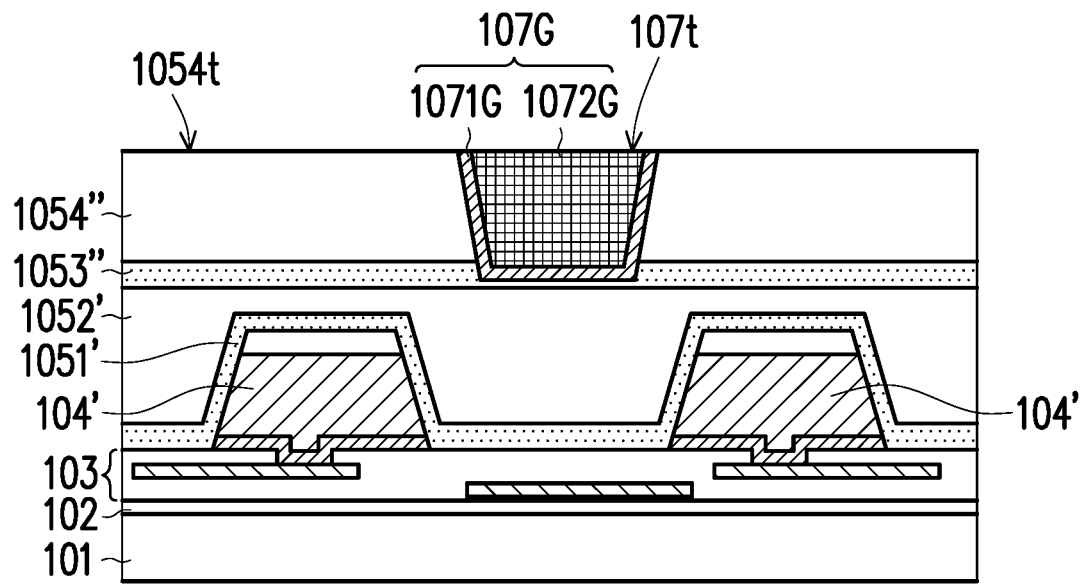

Referring to FIG. 7B and with reference to FIG. 7A, once the recess RD4 is formed, the first patterned mask PR6 may be removed through any suitable process. Next, a dummy feature 107G may be formed in the recess RD4, where a diffusion barrier layer 1071G may be conformally formed in the recess RD4 and a metallic layer 1072G may be formed on the diffusion barrier layer 1071G and fill the recess RD4. In some embodiments, a planarization process (e.g., CMP, grinding, etching, and/or the like) is performed to planarize the second dielectric material layer 1054″ and the dummy feature 107G. For example, the top surface 1054t of the second dielectric material layer 1054″ is substantially leveled (or coplanar) with the top surface 107t of the dummy feature 107G, within process variations.

Figure 7C:
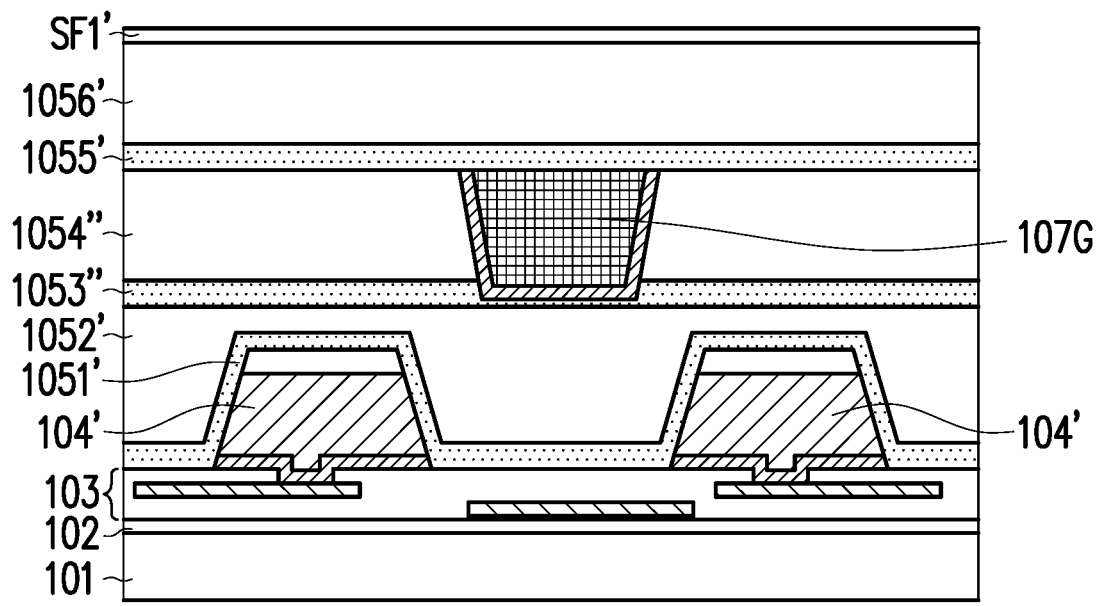

Referring to FIG. 7C and with reference to FIG. 7B, a third etch stop material 1055' may be formed on the top surface 1054t of the second dielectric material layer 1054″ and the top surface 107t of the dummy feature 107G. A third dielectric material 1056' and the sacrificial material SF1' may be sequentially formed on the third etch stop material 1055'. The materials of the third etch stop material 1055', the third dielectric material 1056', and the sacrificial material SF1' may be similar to the second etch stop material 1053', the second dielectric material 1054', and the sacrificial material SF1', respectively, as described in FIG. 1E.

Figure 7D:
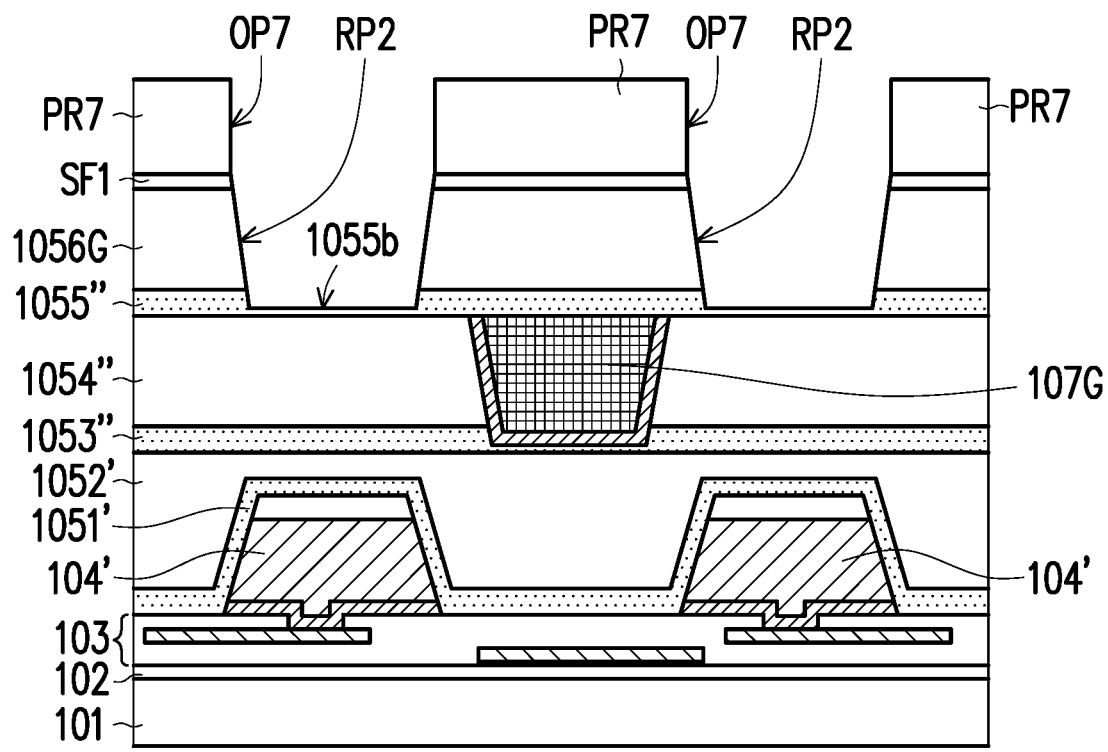

Referring to FIG. 7D and with reference to FIG. 7C, a second patterned mask PR7 having openings OP7 may be formed on the sacrificial material SF1'. The second patterned mask PR7 may be a photoresist, which is patterned through a light-exposure process and a development process. One or more etching process may be performed by using the second patterned mask PR7 as an etching mask. The etching process is similar to the process described in FIG. 1F. The openings OP7 of the second patterned mask PR7 may be used to define pad holes for pad portions of bonding connectors. The openings OP7 may not overlap the dummy feature 107G. For example, a portion of the sacrificial material SF1', a portion of the third dielectric material 1056' underlying the portion of the sacrificial material SF1', and a portion of the third etch stop material 1055' underlying the portion of the third dielectric material 1056' are removed to form the recesses RP2. The respective recess RP2 may be defined by the sacrificial pattern SF1, the third dielectric layer 1056G, and the third etch stop material layer 1055″. The bottom surface 1055b of the third etch stop material layer 1055″ may be accessibly exposed by the recesses RP2. As shown in the cross-sectional view, the recesses RP2 may be laterally and vertically staggered from the dummy feature 107G.

Figure 7E:
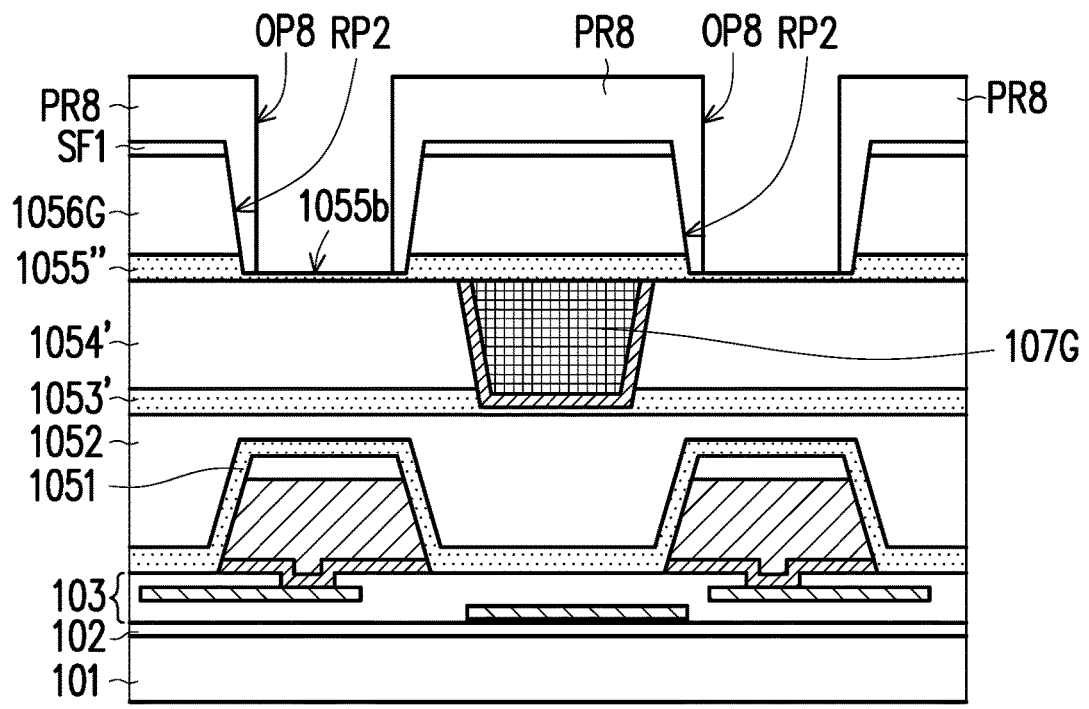

Referring to FIG. 7E and with reference to FIG. 7D, once the recesses RP2 are formed, the second patterned mask PR7 may be removed through any suitable process. Next, a third patterned mask PR8 having openings OP8 may be formed on the sacrificial pattern SF1. The third patterned mask PR8 may be a photoresist, which is patterned through a light-exposure process and a development process. The openings OP8 of the third patterned mask PR8 may be used to define via holes for via portions of bonding connectors. For example, each of the openings OP8 corresponds to one of the recesses RP2. A portion of the third patterned mask PR8 may extend into the respective recess RP2 to cover the bottom surface 1055b of the third etch stop material layer 1055″ and the sidewalls of the sacrificial pattern SF1, the third dielectric layer 1056G, and the third etch stop material layer 1055″. The processes at this step are similar to the processes described in FIG. 1G, and thus the detailed descriptions are omitted.

Figure 7F:
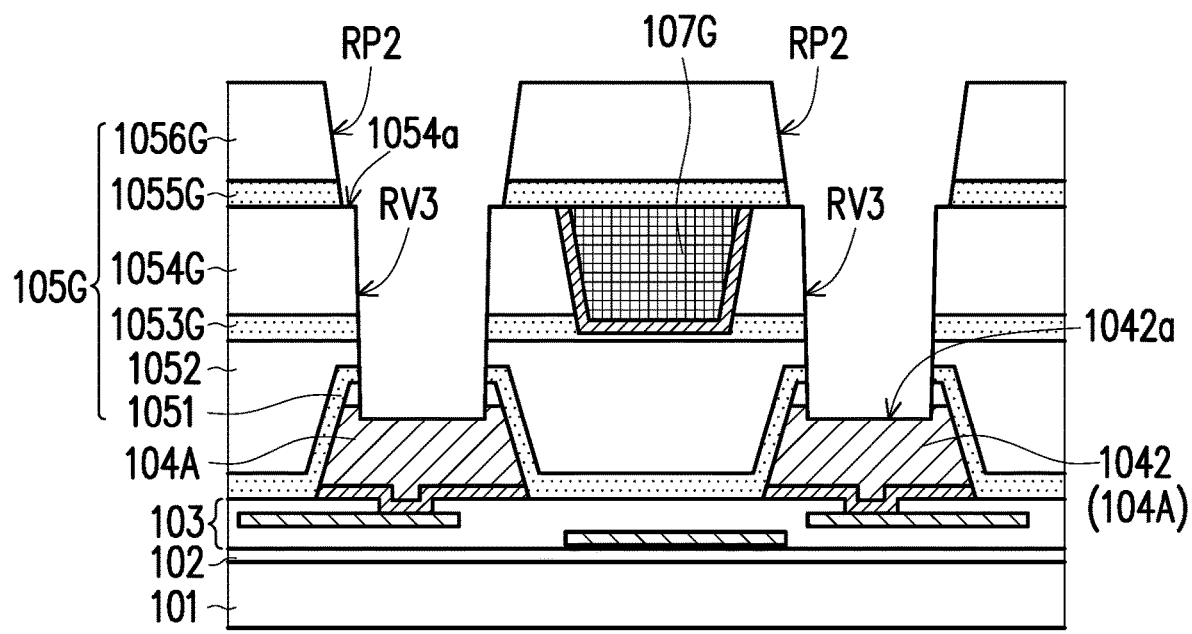

Referring to FIG. 7F and with reference to FIG. 7E, via holes RV3 connected to the recesses RP2 may be formed by using the third patterned mask PR8. Once the via holes RV3 are formed, the third patterned mask PR8 is then removed to accessibly reveal the recesses RP2 through any suitable process. The processes at this step are similar to the process described in FIG. 1H, and thus the detailed descriptions are omitted. For example, after forming the via holes RV3, the dielectric structure 105G including the first etch stop layer 1051, the overlying first dielectric layer 1052, the overlying second etch stop layer 1053G, the overlying second dielectric layer 1054G, the overlying third etch stop layer 1055G, and the overlying third dielectric layer 1056G is formed. After removing the third patterned mask PR8, a portion of the top surface 1054a of the second dielectric layer 1054G may be accessibly exposed by the respective recess RP2. During the same step of forming the via holes RV3, the contact pads 104A having the top surfaces 1042a of the metal pad layers 1042 accessibly exposed are also formed for further electrical connection.

Figure 7G:
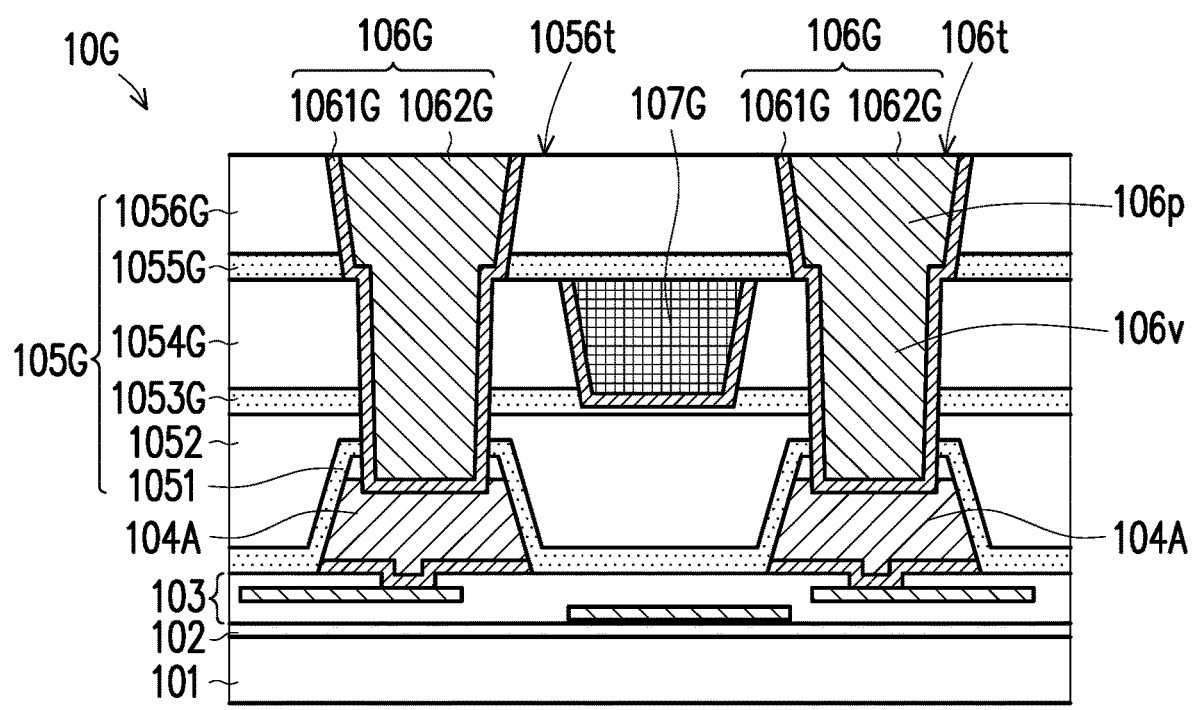

Referring to FIG. 7G and with reference to FIG. 7F, bonding connectors 106G may be formed in the recesses RP2 and the via holes RV3. For example, the diffusion barrier layer 1061G may be conformally formed in the recesses RP2 and the underlying via holes RV3, and the metallic layer 1062G overlying the diffusion barrier layer 1061G may fill the rest space in the recesses RP2 and the via holes RV3. A planarization process (e.g., CMP, grinding, etching, and/or the like) may be performed to planarize the dielectric structure 105G and the bonding connectors 106G so that the top surface 1056t of the third dielectric layer 1056G may be substantially leveled (or coplanar) with the top surfaces 106t of the bonding connectors 106G. Up to here, the fabrication of a tier 10G of a semiconductor structure is substantially complete.

As shown in FIG. 7G, the dummy feature 107G of the tier 10G is embedded in the dielectric structure 105G. The pad portions 106p of the bonding connectors 106G and the dummy feature 107G are not located at the same level. The dummy feature 107G may be laterally interposed between two adjacent via portions 106v of the bonding connectors 106G. It should be noted that the bonding connector 106G and the contact pad 104A of the tier 10G may be replaced with the bonding connector 106B and the contact pad 104B shown in FIG. 3A or the bonding connector 106G may be replaced with the bonding connector 106C shown in FIG. 3B. The shape of the dummy feature 107G of the tier 10G may be replaced with the dummy feature 107D shown in FIG. 4C. Combination schemes may be formed to include different types of semiconductor dies discussed herein, so that variations thereof may be carried out while still remaining within the scope of the claims and disclosure.

Figure 8A:
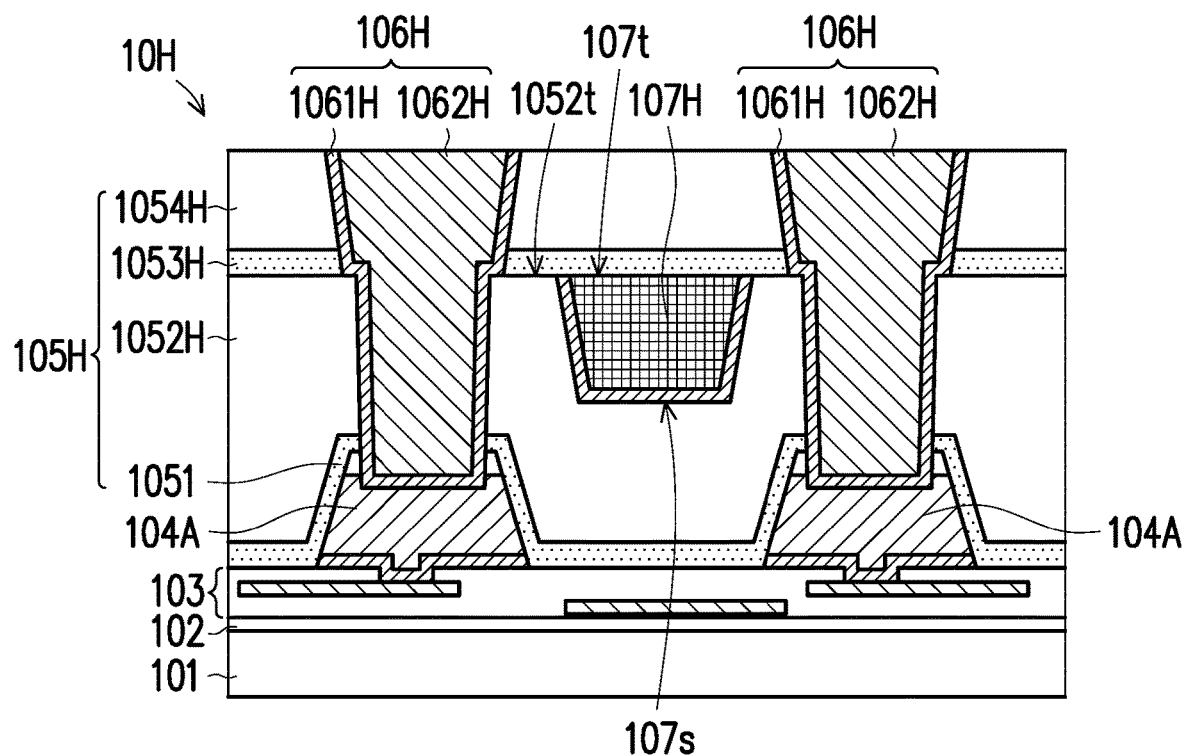
FIGS. 8A-8B are schematic cross-sectional views showing variations of a tier of a semiconductor structure according to some embodiments.
Figure 8B:
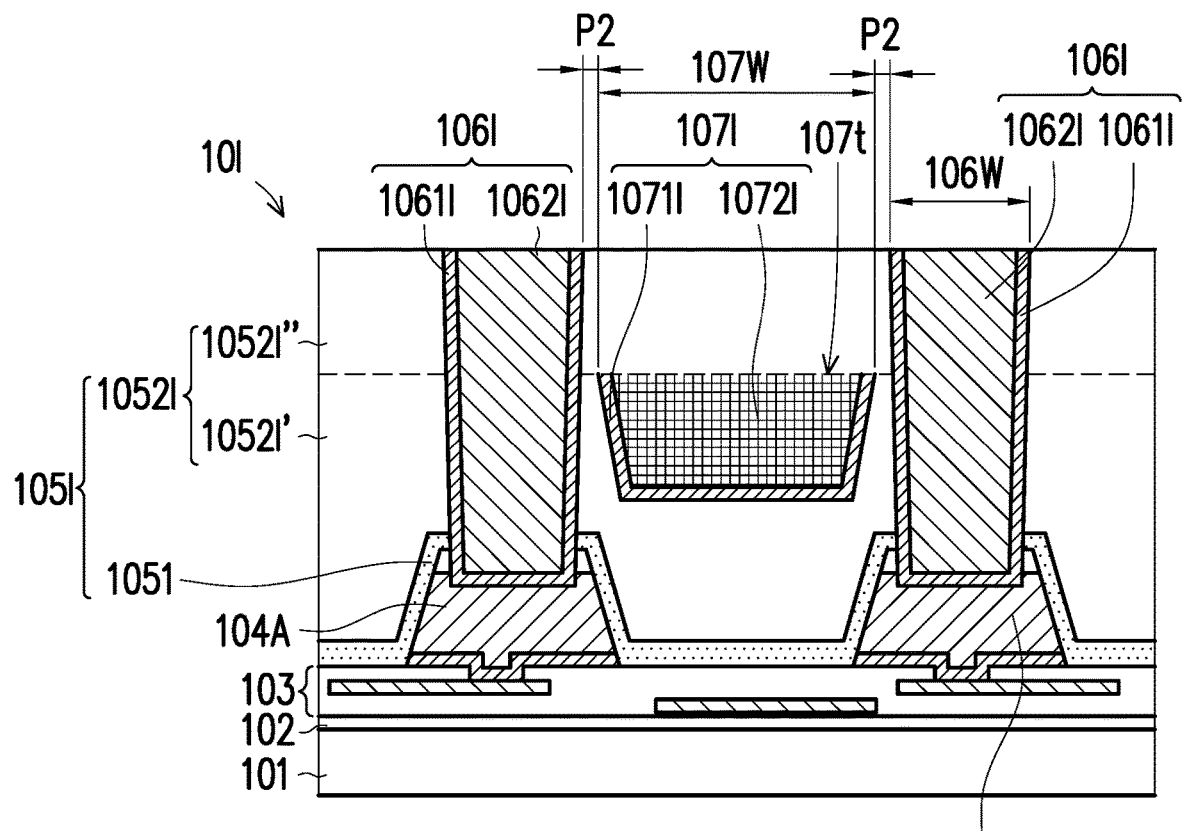

FIGS. 8A-8B are schematic cross-sectional views showing variations of a tier of a semiconductor structure according to some embodiments. Tiers 10H and 10I shown in FIGS. 8A and 8B are similar to the tier 10G illustrated in FIG. 7G, and like elements are designated with the same reference numbers for ease of understanding and the details thereof are not repeated herein. Referring to FIG. 8A and with reference to FIG. 7G, the difference between the tiers 10H and 10G includes the number of layers in the dielectric structure 105H. For example, the dielectric structure 105H of the tier 10H includes the first etch stop layer 1051, the overlying first dielectric layer 1052H, the overlying second etch stop layer 1053H, and the overlying second dielectric layer 1054H. The dummy feature 107H may be embedded in the first dielectric layer 1052H. The sidewall and the bottom surface 107s of the dummy feature 107H may be directly covered by the first dielectric layer 1052H. The top surface 107t of the dummy feature 107H may be substantially leveled (or coplanar) with the top surface 1052t of the first dielectric layer 1052H, within process variations.

The respective bonding connector 106H including the diffusion barrier layer 1061H and the metallic layer 1062H may penetrate through the second dielectric layer 1054H, the second etch stop layer 1053H, and the first dielectric layer 1052H to be in electrical contact with the corresponding contact pad 104A. It should be noted that the bonding connector 106H and the contact pad 104A of the tier 10H may be replaced with the bonding connector 106B and the contact pad 104B shown in FIG. 3A or the bonding connector 106H may be replaced with the bonding connector 106C shown in FIG. 3B. The shape of the dummy feature 107H of the tier 10G may be replaced with the dummy feature 107D shown in FIG. 4C. Combination schemes may be formed to include different types of semiconductor dies discussed herein, so that variations thereof may be carried out while still remaining within the scope of the claims and disclosure.

Referring to FIG. 8B, the dielectric structure 105I of the tier 10I may include the first etch stop layer 1051 and the overlying first dielectric layer 1052I, where the first dielectric layer 1052I includes a first portion 1052I' overlying the first etch stop layer 1051 and a second portion 1052I" overlying the first portion 1052'. The dummy feature 107I of the tier 10I including the diffusion barrier layer 1071I and the metallic layer 1072I may be buried in the first dielectric layer 1052I. For example, the top surface 107t of the dummy feature 107I is at the interface of the first portion 1052' and the second portion 1052I". When the first portion 1052I' and the second portion 1052I" are of the same material, no interface can be observed therebetween, and thus a dashed line indicates that the interface may not exist. The bonding connectors 106I of the tier 10I including the diffusion barrier layer 1061I and the metallic layer 1062I may penetrate through the first etch stop layer 1051 and the first dielectric layer 1052I and may be formed by using a single damascene process. The bonding connectors 106I may be similar to the bonding connectors 106F shown in FIG. 6B, and thus the detailed descriptions are omitted.

In some embodiments, the dummy feature 107I may have a maximum lateral dimension 107W greater than a maximum lateral dimension 106W of the respective bonding connector 106I in the cross-sectional view. The dummy feature 107I may be spaced apart from the bonding features 106I by a shortest lateral distance P2, where the shortest lateral distance P2 is non-zero. For example, the shortest lateral distance P2 is larger than or substantially equal to about 0.1 μm. It should be noted that the value of the shortest lateral distance P2 may vary depending on the process capability of the technology node. The dummy feature 107I interposed between two adjacent bonding connectors 106I may be substantially equidistant from these two adjacent bonding connectors 106I, within process variations. It should be noted that the dummy feature 107I may be replaced with the dummy feature 107D shown in FIG. 4C. One or more bonding connectors 106I may be replaced with the bonding connectors 106C shown in FIG. 3B. Combination schemes may be formed to include different types of semiconductor dies discussed herein, so that variations thereof may be carried out while still remaining within the scope of the claims and disclosure.

Figure 9:
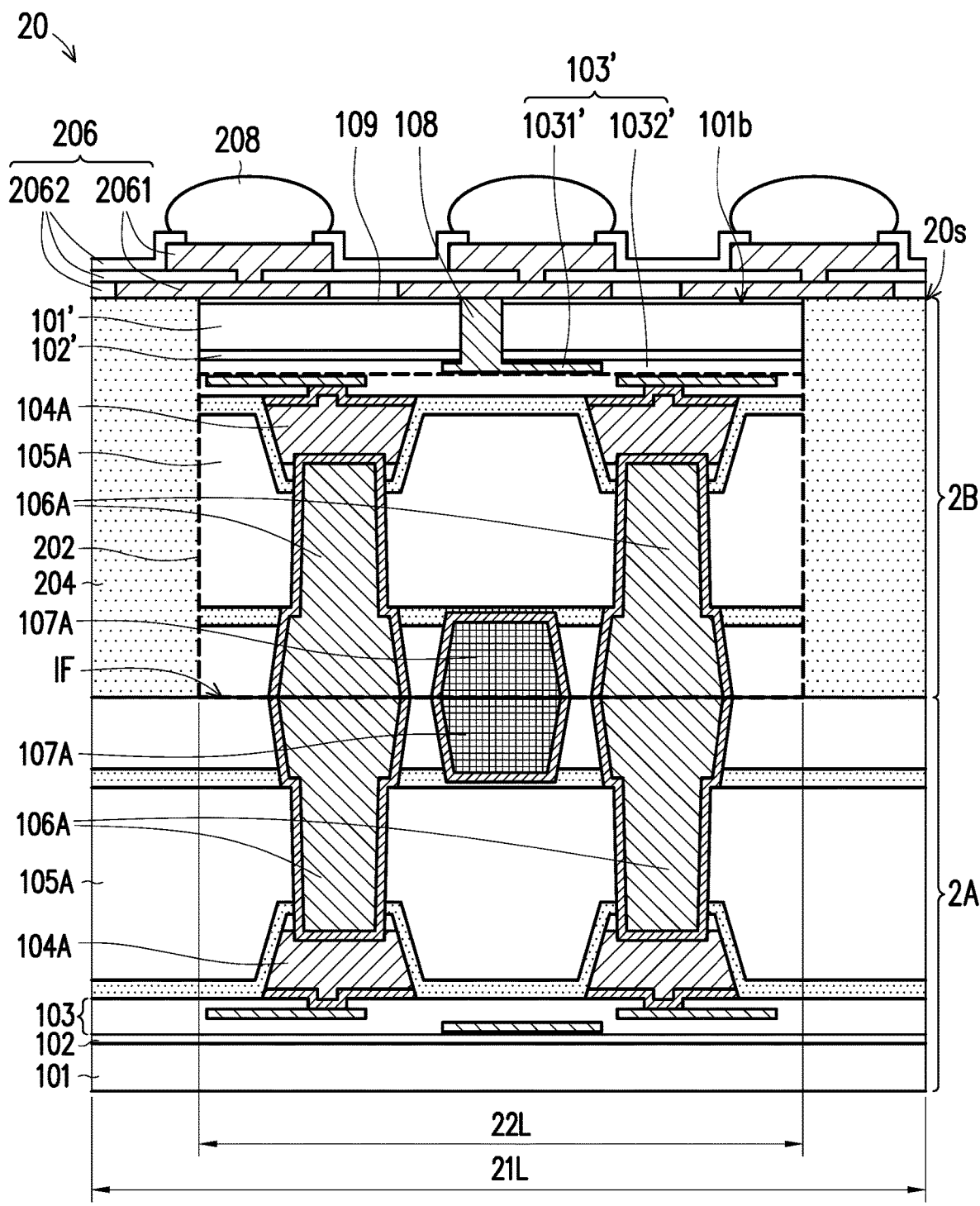
FIG. 9 is a schematic cross-sectional view showing a semiconductor structure according to some embodiments.

FIG. 9 is a schematic cross-sectional view showing a semiconductor structure according to some embodiments. Like elements are designated with the same reference numbers for ease of understanding and the details thereof are not repeated herein. Referring to FIG. 9, a semiconductor structure 20 includes a first tier 2A and a second tier 2B stacked upon the first tier 2A. In the illustrated embodiment, the first tier 2A is the tier 10A described in FIG. 1I. The second tier 2B includes a die component 202 and a dielectric encapsulation 204 laterally covering the die component 202. In some embodiments, a lateral dimension 21L of the first tier 2A is greater than a lateral dimension 22L of the die component 202. For example, the die component 202 is formed by singulating the tier 10A to form a plurality of die components 202, placing the die component 202 on the first tier 2A, and bonding the die component 202 to the first tier 2A.

The bonding process may include at least the following steps. First, surface preparation (e.g., cleaning and activation) for bonding surfaces of the die component 202 and the first tier 2A is performed, where the topmost layer of the dielectric structure 105A may function as bonding dielectric layer. Next, the die component 202 is substantially aligned with the first tier 2A, where the bonding connectors 106A and the dummy feature 107A of the die component 202 are substantially aligned with the bonding connectors 106A and the dummy feature 107A of the first tier 2A, respectively. Next, the die component 202 is pre-bonded to the first tier 2A, where the dielectric structure 105A of the die component 202 is in physical contact with the dielectric structure 105A of the first tier 2A. Subsequently, a dielectric bonding process and a thermal annealing process are performed to form bonds (e.g., metal-to-metal bonds, dielectric-to-dielectric bonds, and/or metal-to-dielectric bonds) at the bonding interface IF of the die component 202 and the first tier 2A.

During the thermal annealing process, metal diffusion and grain growth may occur at the bonding interface IF between the bonding connectors 106A and the dummy features 107A of the die component 202 and the first tier 2A. Typically, the process temperature of the thermal annealing for bonding is high. In the illustrated embodiments, the dummy feature 107A disposed between two adjacent bonding connectors 106A may facilitate the metal diffusion and the grain growth to form reliable metal-to-metal bonds at the bonding interface IF. Even if the process temperature of the thermal annealing process is relatively low (e.g., lower than about 280° C.), the reliable metal-to-metal bonds at the bonding interface IF may be achieved by configuring the dummy features 107A between the bonding connectors 106A. After the bonding is performed, the bonding connectors 106A of the die component 202 and the first tier 2A provide vertical and electrical connections in the semiconductor structure 20. The dummy features 107A in the semiconductor structure 20 are electrically isolated from the underlying conductive features. The dummy features 107A may not have electrical functions, and may be electrically floating.

The die component 202 may include a through substrate via (TSV) 108 penetrating through the semiconductor substrate 101' and the device layer 102' and extending into the dielectric layer 1032' of the interconnect structure 103' to be in physical and electrical contact with one of the interconnecting layers 1032'. A portion of the TSV 108 may be protruded from the back side 101b of the semiconductor substrate 101'. The die component 202 may include an isolation layer 109 formed on the back side 101b of the semiconductor substrate 101' to laterally cover the TSV 108. The dielectric encapsulation 204 may be formed on the dielectric structure 105A of the first tier 10A. A material of the dielectric encapsulation 204 may be or may include silicon oxide, silicon nitride, tetraethoxysilane (TEOS), and/or the like. In alternative embodiments, the dielectric encapsulation 204 includes a molding compound, a molding underfill, an epoxy, a resin, and/or the like. In some embodiments, the top surfaces of the dielectric encapsulation 204, the TSV 108, and the isolation layer 109 are substantially leveled (or coplanar), within process variations.

The semiconductor structure 20 may include a redistribution structure 206 formed on the dielectric encapsulation 204 and the die component 202. The redistribution structure 206 may include alternately stacked dielectric layers 2062 and conductive layers 2061, where the conductive layers 2061 including conductive vias, conductive lines, and conductive pads may be electrically connected to the TSV 108 of the die component 202. The semiconductor structure 20 may have a conterminous outer sidewall 20s, where the outer sidewall 20s is formed by sidewalls of the redistribution structure 206, the dielectric encapsulation 204, and the first tier 2A that are aligned with one another. The semiconductor structure 20 may include conductive terminals 208 formed on the conductive pads of the topmost one of the conductive layers 2061. The conductive terminals 208 may be electrically coupled to the die component 202 and the first tier 2A through the redistribution structure 206. The conductive terminals 170 may include a conductive material such as solder, copper, aluminum, gold, nickel, silver, palladium, tin, the like, or a combination thereof. For example, the conductive terminals 208 may be or may include microbumps, controlled collapse chip connection (C4) bumps, metal pillars, solder balls, ball grid array (BGA) connectors, electroless nickel-electroless palladium-immersion gold (ENEPIG) formed bumps, or the like.

The semiconductor structure 20 may be system-on-chip (SoC) or system-on-integrated-circuit (SoIC) devices. In such embodiments, the processing, memory, and/or electronic control functionality may be integrated on the semiconductor structure 20. It should be noted that the first tier 2A may be replaced with any tier (10B through 10I) described in the disclosure, and the dashed area in the die component 202 may be placed with any configuration of tier (10B through 10I) described in the disclosure. Combination schemes may be formed to include different types of a tier of a semiconductor structure discussed herein, so that variations thereof may be carried out while still remaining within the scope of the claims and disclosure.

In accordance with some embodiments, a semiconductor structure includes an interconnect structure disposed over a semiconductor substrate, contact pads disposed on the interconnect structure, a dielectric structure disposed on the interconnect structure and covering the contact pads, bonding connectors covered by the dielectric structure and landing on the contact pads, and a dummy feature covered by the dielectric structure and laterally interposed between adjacent two of the bonding connectors. Top surfaces of the bonding connectors are substantially coplanar with a top surface of the dielectric structure, and the bonding connectors are electrically coupled to the interconnect structure through the contact pads.

In accordance with some embodiments, a semiconductor structure includes a first tier and a second tier stacked upon the first tier. A bonding interface of the first tier and the second tier is substantially flat. The first tier includes first contact pads disposed on a first interconnect structure over a first semiconductor substrate, a first dielectric structure disposed on the first interconnect structure and covering the first contact pads, first bonding connectors covered by the first dielectric structure and coupled to the first contact pads, and a first dummy feature covered by the first dielectric structure and laterally interposed between adjacent two of the first bonding connectors. The second tier includes a die component and a dielectric encapsulation disposed on the first dielectric structure of the first tier and laterally covering the die component. The die component includes second contact pads disposed below a second interconnect structure underlying a second semiconductor substrate, a second dielectric structure underlying the second interconnect structure and covering the second contact pads, and second bonding connectors covered by the second dielectric structure and coupled to the second contact pads. The second dielectric structure is bonded to the first dielectric structure, and the second bonding connectors are bonded to the first bonding connectors.

In accordance with some embodiments, a manufacturing method of a semiconductor structure includes at least the following steps. Contact pads are formed on an interconnect structure over a semiconductor substrate. A dielectric material stack is formed on the interconnect structure. Holes and a recess are formed in the dielectric material stack to form a dielectric structure, where the holes accessibly expose portions of the contact pads, and the recess is formed between adjacent two of the holes. Conductive materials are formed in the holes and the recess to respectively form bonding connectors and a dummy feature, where the bonding connectors land on the contact pads, and the dummy feature is isolated and substantially equidistant from adjacent two of the bonding connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    an interconnect structure disposed over a semiconductor substrate;
    contact pads disposed on the interconnect structure;
    a dielectric structure disposed on the interconnect structure and covering the contact pads;
    bonding connectors covered by the dielectric structure and landing on the contact pads, top surfaces of the bonding connectors being substantially coplanar with a top surface of the dielectric structure, and the bonding connectors being electrically coupled to the interconnect structure through the contact pads; and
    a dummy feature covered by the dielectric structure and laterally interposed between adjacent two of the bonding connectors, wherein a maximum height of the dummy feature is greater than a maximum height of one of the adjacent two of the bonding connectors.

2. The semiconductor structure of claim 1, wherein a top surface of the dummy feature is substantially coplanar with the top surface of the dielectric structure and the top surfaces of the bonding connectors.

3. The semiconductor structure of claim 1, wherein:
    the dielectric structure comprises dielectric layer and an etch stop layer underlying the dielectric layer, and
    the dummy feature is laterally covered by the dielectric layer and the etch stop layer, and a bottom surface of the dummy feature is in direct contact with the etch stop layer.

4. The semiconductor structure of claim 1, wherein:
    each of the contact pads comprises a metal pad layer and a capping layer overlying the metal pad layer, and a corresponding one of the bonding connectors penetrates through the capping layer to land on the metal pad layer.

5. The semiconductor structure of claim 4, wherein the metal pad layer comprises a recessed top surface, and the corresponding one of the bonding connectors is disposed on the recessed top surface of the metal pad layer.

6. The semiconductor structure of claim 1, wherein the dummy feature is substantially equidistant from the adjacent two of the bonding connectors.

7. The semiconductor structure of claim 1, wherein each of the bonding connectors comprises a metallic layer and a diffusion barrier layer separating the metallic layer from the dielectric structure.

8. The semiconductor structure of claim 1, wherein the dummy feature comprises a metallic layer and a diffusion barrier layer separating the metallic layer from the dielectric structure.

9. A semiconductor structure, comprising:
a first tier comprising:
first contact pads disposed on a first interconnect structure over a first semiconductor substrate;
a first dielectric structure disposed on the first interconnect structure and covering the first contact pads;
first bonding connectors covered by the first dielectric structure and coupled to the first contact pads; and
a first dummy feature covered by the first dielectric structure and laterally interposed between adjacent two of the first bonding connectors, wherein a maximum height of the first dummy feature is greater than a maximum height of one of the adjacent two of the first bonding connectors;
a second tier stacked upon the first tier, a bonding interface of the first tier and the second tier is substantially flat, and the second tier comprising:
a die component comprising:
second contact pads disposed below a second interconnect structure underlying a second semiconductor substrate;
a second dielectric structure underlying the second interconnect structure and covering the second contact pads, the second dielectric structure being bonded to the first dielectric structure;
second bonding connectors covered by the second dielectric structure and coupled to the second contact pads, the second bonding connectors being bonded to the first bonding connectors; and
a dielectric encapsulation disposed on the first dielectric structure of the first tier and laterally covering the die component.

10. The semiconductor structure of claim 9, wherein the die component of the second tier further comprises:
a second dummy feature covered by the second dielectric structure and laterally interposed between adjacent two of the second bonding connectors, and the second dummy feature being bonded to the first dummy feature.

11. The semiconductor structure of claim 9, wherein:
the first dielectric structure of the first tier comprises a dielectric layer and an etch stop layer underlying the dielectric layer, and the first dummy feature is laterally covered by the dielectric layer and the etch stop layer, and a bottom surface of the dummy feature is in direct contact with the etch stop layer.

12. The semiconductor structure of claim 9, wherein:
each of the first contact pads of the first tier comprises a metal pad layer and a capping layer overlying the metal pad layer, and
a corresponding one of the first bonding connectors penetrates through the capping layer to land on the metal pad layer.

13. The semiconductor structure of claim 9, wherein the first dummy feature of the first tier is substantially equidistant from the adjacent two of the first bonding connectors.

14. The semiconductor structure of claim 9, wherein each of the first bonding connectors comprises a metallic layer and a diffusion barrier layer separating the metallic layer from the first dielectric structure.

15. The semiconductor structure of claim 9, wherein the first dummy feature comprises a metallic layer and a diffusion barrier layer separating the metallic layer from the first dielectric structure.

16. A semiconductor structure, comprising:
an interconnect structure disposed over a semiconductor substrate;
contact pads disposed on the interconnect structure;
a dielectric structure disposed on the interconnect structure and covering the contact pads;
bonding connectors covered by the dielectric structure and landing on the contact pads, top surfaces of the bonding connectors being substantially coplanar with a top surface of the dielectric structure, and the bonding connectors being electrically coupled to the interconnect structure through the contact pads; and
a dummy feature covered by the dielectric structure and laterally interposed between adjacent two of the bonding connectors, the dummy feature extending further than the bonding connectors in a height direction of the dummy feature.

17. The semiconductor structure of claim 16, wherein:
the dielectric structure comprises a first etch stop layer covering the contact pads and a second etch stop layer above the first etch stop layer, and
the dummy feature comprises an upper portion landing on the second etch stop layer and a lower portion connected to the upper portion and landing on the first etch stop layer.

18. The semiconductor structure of claim 17, wherein the upper portion of the dummy feature is wider than the lower portion of the dummy feature.

19. The semiconductor structure of claim 17, wherein the second etch stop layer separate the interconnect structure from the lower portion of the dummy feature.

20. The semiconductor structure of claim 16, wherein the bonding connectors and the dummy feature are tapered in a first direction, and the contact pads are tapered in a second direction which is opposite to the first direction.

* * * * *